United States Patent
Huang et al.

(10) Patent No.: US 11,862,715 B2
(45) Date of Patent: *Jan. 2, 2024

(54) VERTICAL TUNNELING FIELD-EFFECT TRANSISTORS

(71) Applicant: Intel Corporation, Santa Clara, CA (US)

(72) Inventors: Cheng-Ying Huang, Hillsboro, OR (US); Jack Kavalieros, Portland, OR (US); Ian Young, Portland, OR (US); Matthew Metz, Portland, OR (US); Willy Rachmady, Beaverton, OR (US); Uygar Avci, Portland, OR (US); Ashish Agrawal, Hillsboro, OR (US); Benjamin Chu-Kung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,822

(22) Filed: May 16, 2022

(65) Prior Publication Data
US 2022/0278227 A1    Sep. 1, 2022

Related U.S. Application Data

(63) Continuation of application No. 16/957,667, filed as application No. PCT/US2018/020162 on Feb. 28, 2018, now Pat. No. 11,335,793.

(51) Int. Cl.
*H01L 29/66* (2006.01)
*H01L 29/06* (2006.01)
(Continued)

(52) U.S. Cl.
CPC .... *H01L 29/66977* (2013.01); *H01L 29/0649* (2013.01); *H01L 29/41733* (2013.01);
(Continued)

(58) Field of Classification Search
CPC ........... H01L 29/66977; H01L 29/0649; H01L 29/41733; H01L 29/66522;
(Continued)

(56) References Cited

U.S. PATENT DOCUMENTS

| 9,287,362 | B1 | 3/2016 | Basu et al. |
| 11,335,793 | B2* | 5/2022 | Huang ................ H01L 29/205 |

(Continued)

FOREIGN PATENT DOCUMENTS

| KR | 1020150016769 | 2/2015 |
| WO | 2017003409 | 1/2017 |

OTHER PUBLICATIONS

Final Office Action from U.S. Appl. No. 16/957,667 dated Oct. 21, 2021, 7 pgs.
(Continued)

*Primary Examiner* — Tong-Ho Kim
(74) *Attorney, Agent, or Firm* — Essential Patents Group, LLP

(57) ABSTRACT

Tunneling Field Effect Transistors (TFETs) are promising devices in that they promise significant performance increase and energy consumption decrease due to a steeper subthreshold slope (for example, smaller sub-threshold swing). In various embodiments, vertical fin-based TFETs can be fabricated in trenches, for example, silicon trenches. In another embodiment, vertical TFETs can be used on different material systems acting as a substrate and/or trenches (for example, Si, Ge, III-V semiconductors, GaN, and the like). In one embodiment, the tunneling direction in the channel of the vertical TFET can be perpendicular to the
(Continued)

Si substrates. In one embodiment, this can be different than the tunneling direction in the channel of lateral TFETs.

20 Claims, 12 Drawing Sheets

(51) Int. Cl.
  *H01L 29/417* (2006.01)
  *H01L 29/786* (2006.01)
(52) U.S. Cl.
  CPC .. *H01L 29/66522* (2013.01); *H01L 29/66742* (2013.01); *H01L 29/78618* (2013.01); *H01L 29/78642* (2013.01); *H01L 29/78681* (2013.01); *H01L 29/78696* (2013.01)
(58) Field of Classification Search
  CPC ......... H01L 29/66742; H01L 29/78618; H01L 29/78642; H01L 29/78681; H01L 29/78696; H01L 29/10; H01L 29/205; H01L 29/401; H01L 29/66356; H01L 29/7391; H01L 29/66969; H01L 29/423
  USPC ........................................................ 257/400
  See application file for complete search history.

(56) References Cited

U.S. PATENT DOCUMENTS

| | | |
|---|---|---|
| 2013/0105860 A1 | 5/2013 | Lochtefeld et al. |
| 2014/0138744 A1 | 5/2014 | Kotlyar et al. |
| 2014/0291616 A1 | 10/2014 | Park et al. |
| 2014/0299923 A1 | 10/2014 | Chang |
| 2015/0200288 A1 | 7/2015 | Zhang et al. |
| 2018/0308960 A1 | 10/2018 | Afzalian |
| 2019/0296145 A1 | 9/2019 | Huang et al. |
| 2020/0027950 A1 | 1/2020 | Zhu et al. |
| 2020/0144374 A1 | 5/2020 | Ma et al. |

OTHER PUBLICATIONS

International Search Report & Written Opinion dated Dec. 3, 2018 for PCT Patent Application No. PCT/US2018/020162.

Non-Final Office Action from U.S. Appl. No. 16/957,667 dated Apr. 30, 2021, 16 pgs.

Notice of Allowance from U.S. Appl. No. 16/957,667 dated Feb. 2, 2022, 8 pgs.

\* cited by examiner

VERTICAL TUNNELING FIELD-EFFECT TRANSISTORS

CLAIM OF PRIORITY

This application is a continuation of, and claims the benefit of priority to, U.S. patent application Ser. No. 16/957,667, filed on Jun. 24, 2020 and titled "VERTICAL TUNNELING FIELD-EFFECT TRANSISTORS," which is a National Stage Entry of, and claims the benefit of priority to, PCT Application No. PCT/US2018/020162, filed on Feb. 28, 2018 and titled "VERTICAL TUNNELING FIELD-EFFECT TRANSISTORS," which is incorporated by reference in entirety.

TECHNICAL FIELD

The present invention generally relates to integrated circuits. More specifically, the present invention relates to vertical tunneling field-effect transistors.

BACKGROUND

As transistor size in integrated circuits (ICs) decreases, the power supply voltage to the transistors may also need to decrease. As the power supply voltage decreases, the threshold voltage of the transistors in the ICs may also need to decrease. Lower threshold voltages can be difficult to obtain in conventional metal-oxide-semiconductor field-effect transistors (MOSFETs) because, as the threshold voltage is reduced, the ratio of ON-current to OFF-current may also decrease. The ON-current can refer to the current through a MOSFET when a voltage applied to the gate is above the threshold voltage and can be as large as or equal to the supply voltage. The OFF-current can refer to current through a MOSFET when a voltage applied to the gate is below the threshold voltage and can equal zero volts.

BRIEF DESCRIPTION OF THE FIGURES

Reference will now be made to the accompanying drawings, which are not necessarily drawn to scale, and wherein.

DETAILED DESCRIPTION

Figure 1:
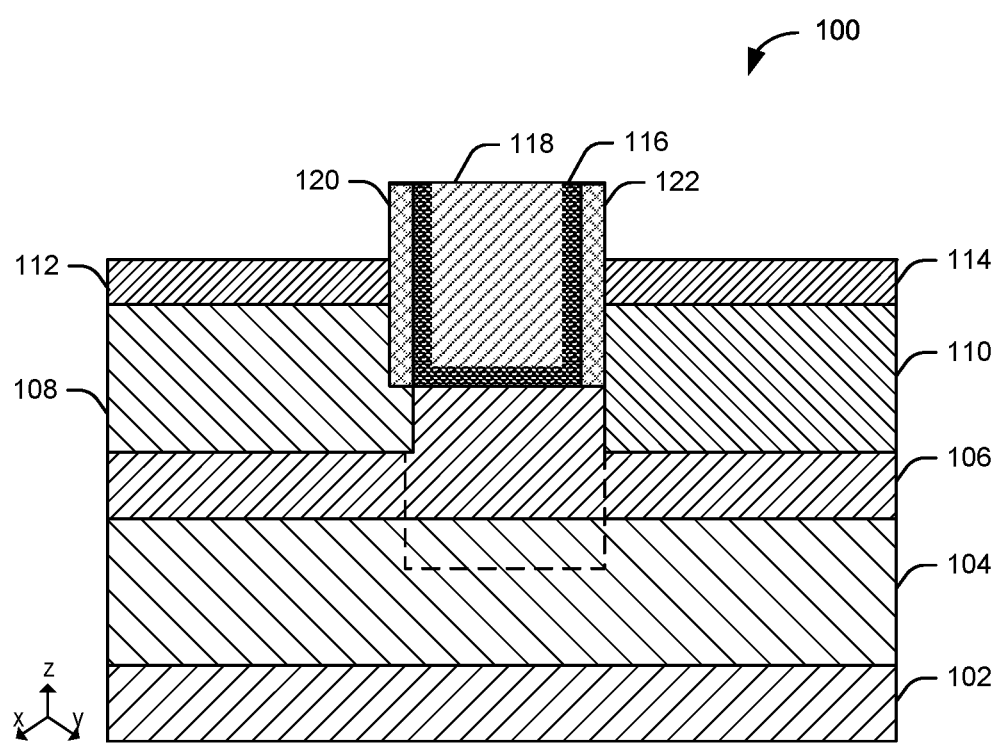
FIG. 1 shows a diagram an example transistor, for example, a tunneling field effect transistor (TFET) having a lateral structure, in accordance with one or more example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The terms "on," "over," "above," "higher," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary elements at the interface between the two elements. The term "processing" as used herein includes deposition of material or photoresist, patterning, exposure, development, etching, cleaning, ablating, polishing, and/or removal of the material or photoresist as required in formation of a described structure.

"An embodiment," "various embodiments," and the like indicate embodiment(s) so described may include particular features, structures, or characteristics, but not every embodiment necessarily includes the particular features, structures, or characteristics. Some embodiments may have some, all, or none of the features described for other embodiments. "First," "second," "third," and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment. The terms "perpendicular," "orthogonal," "coplanar," and/or "parallel" may mean substantially perpendicular, orthogonal, coplanar, or parallel, respectively (e.g., perpendicular within +/−10 degrees). Further, the figures shown herein may not have precisely vertical or horizontal edges, but rather may have some finite slope and have surface roughness, as is to be expected for fabricated devices.

Tunneling field effect transistors (TFETs) represent a class of transistors that can feature performance increases and energy consumption decreases due to a steeper subthreshold slope (for example, smaller sub-threshold swing) in comparison to MOSFETs. A TFET structure can be similar to a MOSFET structure, except that the source and drain terminals of a TFET can be doped of opposite type; that is, a source can be p-type, while the drain can be n-type (or vice-versa). For example, a TFET device structure can include a p-type, intrinsic, n-type (P-I-N or PIN) junction, in which the electrostatic potential of the intrinsic region can be controlled by a gate terminal.

In various embodiments, a fin-based TFETs can refer to a transistor architecture that uses raised channels, referred to herein as fins, from source to drain. One characteristic of the fin-based TFET can be that the conducting channel can be wrapped by a thin fin, which can form the body of the fin-based TFET device. In one embodiment, the thickness of the fin (for example, measured in the direction from source to drain) can determine the effective channel length of the device. The wrap-around gate structure can provide electrical control over the channel and can reduce the leakage current other short-channel effects, such as drain-induced barrier lowering (DIBL). Such effects can make it less likely for the voltage on a gate electrode to deplete the channel underneath the gate electrode and thereby stop the flow of carriers through the channel, thereby turning the transistor off. By raising the channel above the surface of the wafer instead of creating the channel just below the surface, it can be possible to wrap the gate around all but one of the gate's sides, providing greater electrostatic control over the carriers within the channel. Further, in one embodiment, nonplanar devices such as fin-based TFETs can be more compact than planar transistors, thereby enabling higher transistor density, which can translate to smaller overall sizes for microelectronic devices.

In one embodiment, vertical fin-based TFETs (also referred to herein simply as vertical TFETs) can be fabricated in trenches, for example, silicon trenches. In another embodiment, vertical TFETs can be used on different material systems acting as a substrate and/or trenches. For example, the vertical TFETs can be used on silicon (Si), germanium (Ge), III-V semiconductors, gallium nitride (GaN), and the like.

In another embodiment, the vertical TFETs can be fabricated using an aspect ratio trapping (ART) approach. In one embodiment, ART can refer to can generally refer to the technique(s) of causing defects to terminate at non-crystalline, for example, dielectric sidewalls, where the sidewalls are sufficiently high relative to the size of the growth area so as to trap most, if not all, of the defects.

In one embodiment, the tunneling direction in the channel of the vertical TFET can be perpendicular to the substrate (for example, silicon substrate) on which the TFET is fabricated. In one embodiment, this tunneling direction for vertical TFETs can be different, that is perpendicular or near perpendicular, to the tunneling direction in the channel of lateral TFETs.

In one embodiment, a junction of the vertical TFET comprising a source (for example, a source comprising p-doped gallium antimonide), a channel (for example, a channel comprising unintentionally doped indium arsenide), and a drain (for example, a drain comprising an n-doped indium arsenide) be gated at a (110) sidewall of the channel.

In one embodiment, the design and fabrication of a vertical TFET can reduce and/or simplify the fabrication steps needed, for example, as compared with the fabrication steps needed for a lateral TFET. For example, in one embodiment, there may not be a need for a dual p-source, n-drain regrowth process in the fabrication of the vertical TFET.

In one embodiment, the tunneling junction, that is the channel of the vertical TFET may need to be regrown. Accordingly, the vertical tunneling junction may not be exposed to ambient (for example, air) during fabrication, leading to fewer defects, fewer trap-assisted tunneling, and/ or fewer Schottky-Reed-Hall (SRH) leakage. In one embodiment, vertical TFETs can have better scalability in fabrication as compared with lateral TFETs.

FIG. 1 shows a diagram an example transistor, for example, a TFET having lateral structure in accordance with one or more example embodiments of the disclosure. In one embodiment, the transistor 100 can include a substrate 102. In one embodiment, the substrate 102 can refer to a solid (usually planar) substance onto which a layer of another substance is applied, and to which that second substance adheres. In another embodiment, the substrate 102 can include a silicon substrate. In one embodiment, the substrate 102 can include a p-doped silicon substrate. In one embodiment, the substrate 102 can be a thin slice of material such as silicon, silicon oxide, silicon dioxide, aluminum oxide, sapphire, an alloy of silicon and germanium, and/or indium phosphide (InP), and the like. In one embodiment, the substrate 102 can include a semiconductor material (for example, monocrystalline silicon, germanium, silicon germanium, SiGe, and/or a III-V materials based material (for example, gallium arsenide, GaAs), or any combination thereof).

In an embodiment, the substrate 102 can include a flexible substrate. In various embodiments, substrate 102 can include a polymer based substrate, glass, or any other bendable substrate including 2D materials e.g., graphene and $MoS_2$, organic materials, for example, pentacene, transparent oxides e.g., indium gallium zinc oxide (IGZO), polycrystalline III-V materials, polycrystalline Ge, polycrystalline Si, amorphous III-V materials, amorphous Ge, amorphous Si, or any combination thereof. In an embodiment, the amorphous III-V materials can have a deposition temperature lower than that of the polycrystalline III-V materials. In an embodiment, the substrate 102 can be, for example, an organic, a ceramic, a glass, or a semiconductor substrate. In one embodiment, substrate 102 comprises a semiconductor material, e.g., silicon (Si). In one embodiment, substrate 102 can be a monocrystalline Si substrate.

In one embodiment, the substrate 102, for example, a silicon wafer can include a periphery devices, for example, input/output devices. In an embodiment, placing the periphery devices under the substrate 102 can increase the device efficiency while reducing the device area consumption. In an embodiment, the substrate 102 can include electronic devices, for example, transistors, memories, capacitors, resistors, optoelectronic devices, switches, any other active and passive electronic devices that are separated by electrically insulating layers, for example, interlayer dielectric layers, trench insulation layers, or any other insulating layers known to one of ordinary skill in the art of the electronic device manufacturing. In at least some embodiments, the substrate 102 can include metal interconnects and vias configured to connect the metallization layers. In an embodiment, substrate 102 can be a semiconductor-on-isolator (SOI) substrate including a bulk lower substrate, a middle insulation layer, and a top monocrystalline layer. The top monocrystalline layer may comprise, for example, silicon.

In one embodiment, the transistor 100 can include a buffer layer 104. In one embodiment, the buffer layer 104 can include any material suitable to insulate adjacent devices and prevent current leakage. The buffer layer 104 can provide field isolation regions that isolate one fin from other fins (not shown), for example, other fins on adjacent devices. In one embodiment, the buffer layer 104 can include an oxide layer (for example, silicon dioxide), or any other electrically insulating layer. In one embodiment, the buffer layer 104 can include an interlayer dielectric (ILD), such as silicon dioxide. In one embodiment, the buffer layer 104 may include polyimide, epoxy, photodefinable materials (for example, benzocyclobutene, BCB), WPR-series materials, and/or spin-on-glass. In one embodiment, the buffer layer 104 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 104 can be approximately 10 nm to approximately 300 nm, with an example thickness of approximately 30 nm to approximately 50 nm. In one embodiment, the buffer layer 104 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In one embodiment, the transistor 100 can include a channel 106. In another embodiment, the channel 106 can include an indium arsenide (InAs) material. In one embodiment, the channel 106 can include an amorphous oxide semiconductor. In another embodiment, the channel 106 can include a zinc oxide (ZnO), an indium gallium zinc oxide (IGZO), an indium tin oxide (ITO) or an antimony oxide material and/or the like. In one embodiment, the channel 106 may include a material that has a wide-band gap with respect to silicon (approximately 1.1 eV). In one embodiment, the channel 106 can include black phosphorous, amorphous silicon, germanium, carbon nanotube, and the like. In one embodiment, the channel 106 can include silicon, germanium, indium gallium arsenide (InGaAs), gallium nitride (GaN), amorphous semiconductors such as amorphous silicon (a-Si), amorphous germanium (a-Ge), polycrystalline germanium, polycrystalline silicon, and/or polycrystalline InGaAs, and the like. In one embodiment, the channel thickness can depend on which technology is used to generate the transistor. In another embodiment, the channel 106 can be approximately 3 nm to approximately 50 nm thick, with example thicknesses of approximately 5 nm to approximately 20 nm. In one embodiment, the channel 106 can be deposited using PVD, MBE, MOCVD, CVD, and/or ALD, and the like.

In one embodiment, the transistor 100 can include a source 108. In another embodiment, the source 108 can include a p-doped gallium antimonide (p+ GaSb) layer. In another embodiment, the source 108 can include a nonreactive metal. In one embodiment, the source 108 can include tungsten, titanium nitride, aluminum, titanium, tantalum nitride, cobalt, and/or nickel. In another embodiment, the source 108 can include an p-doped indium gallium arsenide layer. In one embodiment, the source 108 can include silicon. In another embodiment, the silicon material may be p-doped. In another embodiment, the source 108 can be fabricated using MBE. In another embodiment, the source 108 can include doped or undoped black phosphorous, titanium, tantalum, cobalt, molybdenum, titanium nitride, tantalum nitride, hafnium, copper, gadolinium, and the like. In one embodiment, the source 108 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 108. In one embodiment, source can include gettering materials. In one embodiment, the gettering materials can getter sulfur. In one embodiment, the source 108 can be doped, for example, by creating vacancies of sulfur and selenium. In one embodiment, the source 108 can be doped with oxygen vacancies if the source comprises an oxide or a multi-material system. In another embodiment, the source 108 can be doped with phosphorous, boron, aluminum, tin, hafnium, titanium, copper, indium, and/or arsenic if the source 108 comprises a non-oxide a single-material semiconductor. In another embodiment, the source 108 can be approximately 1 nanometer to approximately 100 nm thick, with example thicknesses of approximately 10 nm to approximately 50 nm thick. In one embodiment, the source 108 can be deposited using PVD, CVD, MOCVD, MBE, and/or ALD, and the like.

In one embodiment, the transistor 100 can include a drain 110. In another embodiment, the drain 110 can include an n-doped indium arsenide (n+ InAs) layer. In another embodiment, the drain 110 can include a nonreactive metal. In one embodiment, the drain 110 can include tungsten and/or titanium nitride, aluminum, titanium, tantalum nitride, cobalt, and/or nickel material. In another embodiment, the drain 110 can include an n-doped indium gallium arsenide layer. In one embodiment, the drain 110 can include silicon. In another embodiment, the silicon material may be n-doped. In another embodiment, the drain 110 can include doped or undoped black phosphorous, titanium, tantalum, cobalt, molybdenum, titanium nitride, tantalum nitride, hafnium, copper, gadolinium, and the like. In one embodiment, the drain 110 can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating excess electron in the drain 110. In another embodiment, the drain 110 can be doped with phosphorous, boron, aluminum, tin, hafnium, titanium, copper, indium, and/or arsenic if the drain 110 comprises a non-oxide a single-material semiconductor. In another embodiment, the drain 110 can be approximately 1 nanometer to approximately 100 nm thick, with example thicknesses of approximately 10 nm to approximately 50 nm thick. In one embodiment, the drain 110 can be deposited using PVD, CVD, MOCVD, MBE, and/or ALD, and the like.

In one embodiment, the transistor 100 can include a source contact 112 (also known as a contact electrode). In one embodiment, the source contact 112 can include a metal. In one embodiment, the source contact 210 can include gold, copper, silver, aluminum, zinc, tin, platinum, titanium, titanium nitride, tantalum nitride, silicide, tungsten, palladium, molybdenum, germanium, ruthenium, nickel any of the like. The source contact 112 can include any alloys of such materials. In one embodiment, the source contact 112 can have a thickness of approximately 2 nm to approximately 100 nm, with example thicknesses of approximately 5 nm to approximately 20 nm. In one embodiment, the source contact 112 can be deposited using PVD, CVD, MOCVD, MBE, and/or ALD, and the like.

In one embodiment, the transistor 100 can include a drain contact 114. In one embodiment, the drain contact 114 can include a metal. In one embodiment, the metal can include gold, copper, silver, aluminum, zinc, tin, platinum, and any of the like. The drain contact 114 can include any alloys of such materials. In one embodiment, the drain contract 114 can have a thickness of approximately 2 nm to approximately 100 nm, with example thicknesses of approximately 5 nm to approximately 20 nm. In one embodiment, the drain contract 114 can be deposited using PVD, CVD, MOCVD, MBE, and/or ALD, and the like.

In one embodiment, the transistor 100 can include a gate dielectric 116. In one embodiment, the gate dielectric 116 can include a dielectric material. In another embodiment, the gate dielectric 116 can include silicon oxide. In another embodiment, the gate dielectric 116 can include a high-K dielectric material. In another embodiment, the high-K material, for example, hafnium oxide, tantalum oxide, titanium oxide, aluminum oxide, silicon dioxide, silicon nitride and the like. In one embodiment, an electroglass (EG) can be used as the gate dielectric 116. In one embodiment, the gate dielectric 116 can include hexagonal boron nitride (HBN). In one embodiment, the gate dielectric 116 can be deposited using PVD, CVD, and/or ALD, and the like. In one embodiment, the gate dielectric 116 can have a thickness of approximately 1 nm to approximately 10 nm, with an example thickness of approximately 2 nm to approximately 4 nm.

In one embodiment, the transistor 100 can include a gate 118. In one embodiment, a gate 118 can be deposited on the gate dielectric 116. In another embodiment, the gate 118 can include a metal. In another embodiment, the gate 118 can include a transition metal. In one embodiment, the gate 118 can be used to tune the threshold voltage of the device. In one embodiment, gate 118 can titanium nitride, cobalt, tungsten, palladium, molybdenum, germanium, ruthenium, nickel, titanium silicide, and/or platinum. In one embodiment, the gate 118 can be deposited using PVD, CVD, MOCVD, MBE and/or ALD, and the like. In one embodiment, the gate 118 can have a thickness of approximately 30 nm to approximately 100 nm, with an example thickness of approximately 40 nm to approximately 60 nm.

In one embodiment, the transistor 100 can include spacers 120 and 122. In an embodiment, the spacers 120 and 122 can serve to provide electrical insulation between the gate 118 and the source 108 and/or the drain 110. In one embodiment, the spacers 120 and 122 can include silicon oxide or silicon nitride. The spacer can be serve to prevent the source 108 and/or drain 110 from making electrical contact to the gate 118.

Figure 2A:
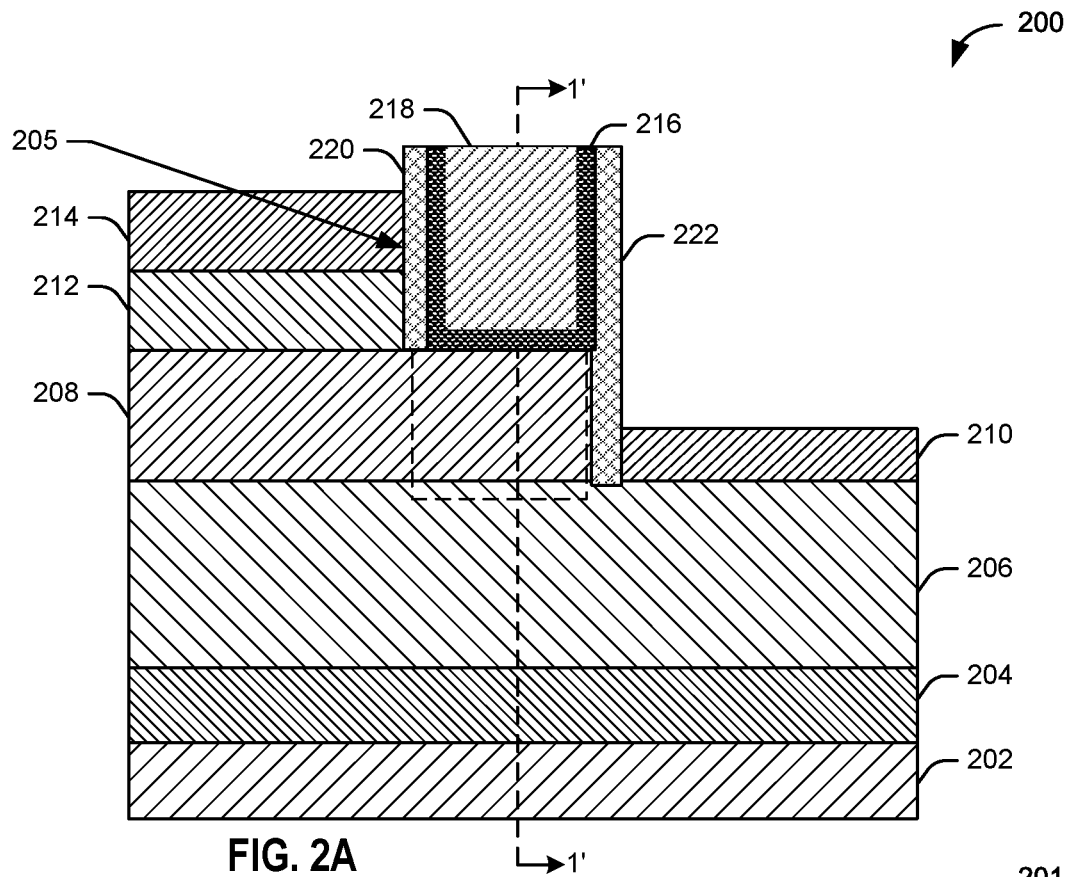
FIG. 2A shows a first view of a transistor, in accordance with one or more example embodiments of the disclosure.

FIG. 2A shows a first view of a transistor 200 in accordance with one or more example embodiments of the disclosure. In particular, a second view, that is a cross-sectional view in the direction of 1-1' of the transistor 200 as shown in FIG. 2A can be seen in FIG. 2B. In one embodiment, the transistor 200 can include a substrate 202. In another embodiment, the substrate 202 can include a silicon layer. In one embodiment, the substrate 202 can refer to a solid (usually planar) substance onto which a layer of another substance is applied, and to which that second substance adheres. In another embodiment, the substrate 202 can include a silicon substrate. In one embodiment, the substrate 202 can include a p-doped silicon substrate. In one embodiment, the substrate 202 can be a thin slice of material such as silicon, silicon oxide, silicon dioxide, aluminum oxide, sapphire, an alloy of silicon and germanium, and/or indium phosphide (InP), and the like. In one embodiment, the substrate 202 can include a semiconductor material (for example, monocrystalline silicon, germanium, silicon germanium, SiGe, and/or a III-V materials based material (for example, gallium arsenide, GaAs), or any combination thereof).

In one embodiment, the transistor 200 can include a buffer layer 204 (also referred to herein as a buffer material). In another embodiment, the buffer layer 204 can include a III-V semiconductor. In one embodiment, the partial structure 200 of the TFET can include a buffer layer 204. In one embodiment, the buffer layer 204 can include any material suitable to insulate adjacent devices and prevent current leakage. In one embodiment, the buffer layer 204 can provide field isolation regions that isolate one fin from other fins (not shown), for example, other fins on adjacent devices. In one embodiment, the buffer layer 204 can include an oxide layer (for example, silicon dioxide), or any other electrically insulating layer. In one embodiment, the buffer layer 204 can include an interlayer dielectric (ILD), such as silicon dioxide. In one embodiment, the buffer layer 204 may include polyimide, epoxy, photodefinable materials (for example, benzocyclobutene, BCB), WPR-series materials, and/or spin-on-glass. In one embodiment, the buffer layer 204 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 204 can be approximately 10 nm to approximately 300 nm, with an example thickness of approximately 30 nm to approximately 50 nm. In one embodiment, the buffer layer 204 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In an embodiment, the buffer layer 204 can be patterned and etched to form trenches, such as trench 205, using one of the patterning and etching techniques known to one of ordinary skill in the art. In one embodiment, the trench 205 can have a depth D of approximately 50 nm to about 300 nm and a width W of approximately 5 nm to about 20 nm. In one embodiment, an aspect ratio of the trench 205 (D/W) can determine the thickness of the buffer layers deposited through that trench. In another embodiment, the higher the D/W ratio of the trench, the thicker the buffer layer 204 can be.

In one embodiment, the transistor 200 can include a source 206. In one embodiment, the source 206 can include a first portion and a second portion. In another embodiment, the source 206 can include a p-doped gallium antimonide layer. In another embodiment, the source 206 can include a nonreactive metal. In one embodiment, the source 206 can include tungsten, titanium nitride, aluminum, titanium, tantalum nitride, cobalt, and/or nickel. In another embodiment, the source 206 can include an p-doped indium gallium arsenide layer. In one embodiment, the source 206 can include silicon. In another embodiment, the silicon material may be p-doped. In another embodiment, the source 206 can include doped or undoped black phosphorous, titanium, tantalum, cobalt, molybdenum, titanium nitride, tantalum nitride, hafnium, copper, gadolinium, and the like. In one embodiment, the source 206 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 206. In one embodiment, source can include gettering materials. In one embodiment, the gettering materials can getter sulfur. In one embodiment, the source 206 can be doped, for example, by creating vacancies of sulfur and selenium. In one embodiment, the source 206 can be doped with oxygen vacancies if the source comprises an oxide or a multi-material system. In another embodiment, the source can be doped with phosphorous, boron, aluminum, tin, hafnium, titanium, copper, indium, and/or arsenic if the source 206 comprises a non-oxide a single-material semiconductor. In another embodiment, the source 206 can be approximately 1 nm to approximately 100 nm thick, with example thicknesses of approximately 10 nm to approximately 50 nm thick. In one embodiment, the source 206 can be deposited using PVD, CVD, MOCVD, MBE, and/or ALD, and the like.

In one embodiment, the transistor 200 can include a channel 208. In one embodiment, the channel 208 is formed on the first portion of the source 206. In one embodiment, the channel 208 includes a first portion and a second portion. In another embodiment, the channel 208 can include a unintentionally doped (UID) indium arsenide layer. In one embodiment, the channel 208 can include an amorphous oxide semiconductor. In another embodiment, the channel 208 can include a zinc oxide (ZnO), an indium gallium zinc oxide (IGZO), an indium tin oxide (ITO) or an antimony oxide material and/or the like. In one embodiment, the channel 208 may include a material that has a wide-band gap with respect to silicon (approximately 1.1 eV). In one embodiment, the channel 208 can include black phosphorous, amorphous silicon, germanium, carbon nanotube, and the like. In one embodiment, the channel 208 can include silicon, germanium, indium gallium arsenide (InGaAs), gallium nitride (GaN), amorphous semiconductors such as amorphous silicon (a-Si), amorphous germanium (a-Ge), polycrystalline germanium, polycrystalline silicon, and/or polycrystalline InGaAs, and the like. In one embodiment, the channel thickness can depend on which technology is used to generate the transistor. In another embodiment, the channel 208 can be approximately 3 nm to approximately 50 nm thick, with example thicknesses of approximately 5 nm to approximately 20 nm. In one embodiment, the channel 208 can be deposited using PVD, CVD, and/or ALD, and the like.

In one embodiment, the transistor 200 can include a gate dielectric 216. In one embodiment, the gate dielectric 216 is formed on the second portion of the channel 208. In one embodiment, the gate dielectric 216 can include a dielectric material. In another embodiment, the gate dielectric 216 can include silicon oxide. In another embodiment, the gate dielectric 216 can include a high-K dielectric material. In another embodiment, the high-K material, for example, hafnium oxide, tantalum oxide, titanium oxide, aluminum oxide, silicon dioxide, silicon nitride and the like. In one embodiment, an electroglass (EG) can be used as the gate dielectric 216. In one embodiment, the gate dielectric 216 can include hexagonal boron nitride (HBN). In one embodiment, the gate dielectric 216 can be deposited using PVD, CVD, and/or ALD, and the like. In one embodiment, the gate dielectric 216 can have a thickness of approximately 1 nm to approximately 10 nm, with an example thickness of approximately 2 nm to approximately 4 nm.

In another embodiment, the transistor 200 can include a gate 218. In one embodiment, a gate 218 can be deposited on the gate dielectric 216. In another embodiment, the gate 218 can include a metal. In another embodiment, the gate 218 can include a transition metal. In one embodiment, the gate 218 can be used to tune the threshold voltage of the device. In one embodiment, gate 218 can titanium nitride, cobalt, tungsten, palladium, molybdenum, germanium, ruthenium, nickel, titanium silicide, and/or platinum. In one embodiment, the gate 218 can be deposited using PVD, CVD, MOCVD, MBE and/or ALD, and the like. In one embodiment, the gate 218 can have a thickness of approximately 30 nm to approximately 100 nm, with an example thickness of approximately 40 nm to approximately 60 nm.

In one embodiment, the transistor 200 can include a drain contact 214. In one embodiment, the drain contact 214 is formed on the first portion of the channel 208. In one embodiment, the drain contact 214 can include a metal. In one embodiment, the drain contact 214 can include gold, copper, silver, aluminum, zinc, tin, platinum, titanium, titanium nitride, tantalum nitride, silicide, tungsten, palladium, molybdenum, germanium, ruthenium, nickel any of the like. The drain contact 214 can include any alloys of such materials. In one embodiment, the drain contract 214 can have a thickness of approximately 2 nm to approximately 100 nm, with example thicknesses of approximately 5 nm to approximately 20 nm. In one embodiment, the drain contract 214 can be deposited using PVD, CVD, MOCVD, MBE, and/or ALD, and the like.

In another embodiment, the transistor 200 can include spacers 220 and 222. In an embodiment, the spacers 220 and 222 can serve to provide electrical insulation between the gate 218 and the source 206 and/or the drain 212. In one embodiment, the spacers 220 and 222 can include silicon oxide or silicon nitride. The spacer can be serve to prevent the source 206 and/or drain 212 from making electrical contact to the gate 218.

In one embodiment, the spacers 220 and 222 can have a triangle shape (not shown). This can be due, for example, to an etching step involved in the fabrication of the spacers 220 and 222. That is, the spacers 220 and 222 may be first deposited as a blanket layer, and then an etch can be used to remove a portion of the insulating spacers 220 and 222 that might remain underneath the source 206 and/or drain 212. In one embodiment, the etch can be a directional etch. In another embodiment, the etch may not etch straight downward (in the negative z direction); rather, the etch may have a slight slant and etch more of the top of the spacers 220 and 222 as well, giving rise to the triangular shape of the spacers 220 and 222.

Figure 2B:
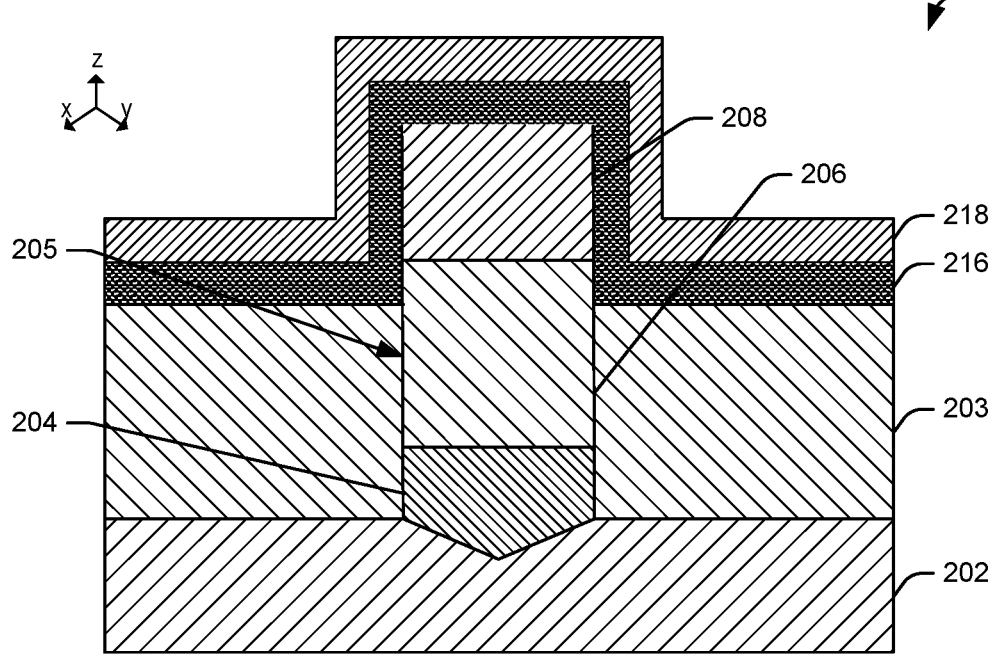
FIG. 2B shows a diagram of a second view of a transistor, in accordance with one or more example embodiments of the disclosure.

FIG. 2B shows a diagram of a second view of a transistor 201 in accordance with one or more example embodiments of the disclosure. In particular, the second view of the transistor 201 comprises a cross-sectional view in the direction of 1-1' of the transistor 200 as shown in FIG. 2A. In one embodiment, the transistor 201 can include a substrate 202. In one embodiment, the substrate 202 can refer to a solid (usually planar) substance onto which a layer of another substance is applied, and to which that second substance adheres. In another embodiment, the substrate 202 can include a silicon substrate. In one embodiment, the substrate 202 can include a p-doped silicon substrate. In one embodiment, the substrate 202 can be a thin slice of material such as silicon, silicon oxide, silicon dioxide, aluminum oxide, sapphire, an alloy of silicon and germanium, and/or indium phosphide (InP), and the like. In one embodiment, the substrate 202 can include a semiconductor material, for example, monocrystalline silicon, germanium, silicon germanium, SiGe, and/or a III-V materials based material (for example, gallium arsenide, GaAs), or any combination thereof). In an embodiment, the substrate 202 can include gallium antimonide (GaSb), silicon on insulator (SOI), germanium on insulator (GOI), or a III-V semiconductor material on silicon (III-V-OI).

In one embodiment, the transistor 201 can include a shallow trench isolation layer (STI layer) 203. The STI layer 203 can also be referred to as an isolation structure herein. In one embodiment, the shallow trench isolation layer 203 can include any material suitable to insulate adjacent devices and prevent current leakage. In one embodiment, the STI layer can provide field isolation regions that isolate one fin from other fins (not shown), for example, other fins on adjacent devices. In one embodiment, the shallow trench isolation layer 203 can include an oxide layer (for example, silicon dioxide), or any other electrically insulating layer. In one embodiment, the shallow trench isolation layer 203 can include an interlayer dielectric (ILD), such as silicon dioxide. In one embodiment, the shallow trench isolation layer 203 may include polyimide, epoxy, photodefinable materials (for example, benzocyclobutene, BCB), WPR-series materials, and/or spin-on-glass. In one embodiment, the shallow trench isolation layer 203 can include a low permittivity (low-k) ILD layer. In one embodiment, low-k can refer to dielectrics having a dielectric constant (permittivity k) lower than the permittivity of silicon dioxide. In one embodiment, the thickness of the shallow trench isolation layer 203 can be approximately 10 nm to approximately 300 nm, with an example thickness of approximately 30 nm to approximately 50 nm. In one embodiment, the shallow trench isolation layer 203 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In one embodiment, the transistor 201 can include a buffer layer 204. In one embodiment, the buffer layer 204 can include a III-V semiconductor material. Such III-V semiconductor material layers can include those materials that are formed by combining group III elements (for example, including Al, Ga, In) with group V elements (for example, including N, P, As, Sb). For example, some III-V semiconductor materials can include, but not be limited to, GaAs, InP GaP and GaN. In one embodiment, the partial structure 200 of the TFET can include a buffer layer 204. In one embodiment, the buffer layer 204 can include any material suitable to insulate adjacent devices and prevent current leakage. In one embodiment, the buffer layer 204 can include a shallow trench isolation (STI) layer. In one embodiment, the STI layer can provide field isolation regions that isolate one fin from other fins (not shown), for example, other fins on adjacent devices. In one embodiment, the buffer layer 204 can include an oxide layer (for example, silicon dioxide), or any other electrically insulating layer. In one embodiment, the buffer layer 204 can include an interlayer dielectric (ILD), such as silicon dioxide. In one embodiment, the buffer layer 204 may include polyimide, epoxy, photodefinable materials (for example, benzocyclobutene, BCB), WPR-series materials, and/or spin-on-glass. In one embodiment, the buffer layer 204 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 204 can be approximately 10 nm to approximately 300 nm, with an example thickness of approximately 30 nm to approximately 50 nm. In one embodiment, the buffer layer 204 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In an embodiment, the buffer layer 204 can be patterned and etched to form trenches, such as trench 205, using one of the patterning and etching techniques known to one of ordinary skill in the art. In one embodiment, the trench 205 can have a depth D of approximately 50 nm to approximately 300 nm and a width W of approximately 5 nm to approximately 20 nm. In one embodiment, an aspect ratio of the trench 205 (D/W) can determine the thickness of the buffer layers deposited through that trench. In another embodiment, the higher the D/W ratio of the trench, the thicker the buffer layer 204 can be.

In one embodiment, the transistor 201 can include a source 206. In another embodiment, the source 206 can include a p-doped gallium antimonide layer. In another embodiment, the source 206 can include a nonreactive metal. In one embodiment, the source 206 can include tungsten, titanium nitride, aluminum, titanium, tantalum nitride, cobalt, and/or nickel. In another embodiment, the source 206 can include a p-doped indium gallium arsenide layer. In one embodiment, the source 206 can include silicon. In another embodiment, the silicon material may be p-doped. In another embodiment, the source 206 can include doped or undoped black phosphorous, titanium, tantalum, cobalt, molybdenum, titanium nitride, tantalum nitride, hafnium, copper, gadolinium, and the like. In one embodiment, the source 206 can include silicon, germanium, silicon germanium (SiGe), indium phosphide (InP), indium arsenide (InAs), indium gallium arsenide (InGaAs), gallium nitride (GaN), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 206. In one embodiment, source can include gettering materials. In one embodiment, the gettering materials can getter sulfur. In one embodiment, the source 206 can be doped, for example, by creating vacancies of sulfur and selenium. In one embodiment, the source 206 can be doped with oxygen vacancies if the source comprises an oxide or a multi-material system. In another embodiment, the source can be doped with phosphorous, boron, aluminum, tin, hafnium, titanium, copper, indium, and/or arsenic if the source 206 comprises a non-oxide a single-material semiconductor. In another embodiment, the source 206 can be approximately 1 nanometer to approximately 100 nm thick, with example thicknesses of approximately 10 nm to approximately 50 nm thick. In one embodiment, the source 206 can be deposited using PVD, CVD, MOCVD, MBE, and/or ALD, and the like.

In one embodiment, the transistor 201 can include a channel 208. In another embodiment, the channel 208 can include a UID indium arsenide layer. In one embodiment, the channel 208 can include an amorphous oxide semiconductor. In another embodiment, the channel 208 can include a zinc oxide (ZnO), an indium gallium zinc oxide (IGZO), an indium tin oxide (ITO) or an antimony oxide material and/or the like. In one embodiment, the channel 208 may include a material that has a wide-band gap with respect to silicon (approximately 1.1 eV). In one embodiment, the channel 208 can include black phosphorous, amorphous silicon, germanium, carbon nanotube, and the like. In one embodiment, the channel 208 can include silicon, germanium, indium gallium arsenide (InGaAs), gallium nitride (GaN), amorphous semiconductors such as amorphous silicon (a-Si), amorphous germanium (a-Ge), polycrystalline germanium, polycrystalline silicon, and/or polycrystalline InGaAs, and the like. In one embodiment, the channel thickness can depend on which technology is used to generate the transistor. In another embodiment, the channel 208 can be approximately 3 nm to approximately 50 nm thick, with example thicknesses of approximately 5 nm to approximately 20 nm. In one embodiment, the channel 208 can be deposited using PVD, MBE, MOCVD, CVD, and/or ALD, and the like.

In one embodiment, the transistor 201 can include a source contact 210. In one embodiment, the source contact 210 can include a metal. In one embodiment, the source contact 210 can include gold, copper, silver, aluminum, zinc, tin, platinum, titanium, titanium nitride, tantalum nitride, silicide, tungsten, palladium, molybdenum, germanium, ruthenium, nickel any of the like. The source contact 210 can include any alloys of such materials. In one embodiment, the source contact 210 can have a thickness of approximately 2 nm to approximately 100 nm, with example thicknesses of approximately 5 nm to approximately 20 nm. In one embodiment, the source contact 210 can be deposited using PVD, CVD, MOCVD, MBE, and/or ALD, and the like.

In an embodiment, the transistor can include a drain 212. In another embodiment, the drain 212 can include an n-doped indium arsenide layer. In another embodiment, the drain 212 can include a nonreactive metal. In one embodiment, the drain 212 can include tungsten and/or titanium nitride, aluminum, titanium, tantalum nitride, cobalt, and/or nickel material. In another embodiment, the drain 212 can include an n-doped indium gallium arsenide layer. In one embodiment, the drain 212 can include silicon. In another embodiment, the silicon material may be n-doped. In another embodiment, the drain 212 can include doped or undoped black phosphorous, titanium, tantalum, cobalt, molybdenum, titanium nitride, tantalum nitride, hafnium, copper, gadolinium, and the like. In one embodiment, the drain 212 can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating excess electron in the drain 212. In another embodiment, the drain 212 can be doped with phosphorous, boron, aluminum, tin, hafnium, titanium, copper, indium, and/or arsenic if the drain 212 comprises a non-oxide a single-material semiconductor. In another embodiment, the drain 212 can be approximately 1 nm to approximately 100 nm thick, with example thicknesses of approximately 10 nm to approximately 50 nm thick. In one embodiment, the drain 212 can be deposited using PVD, CVD, MOCVD, MBE, and/or ALD, and the like.

In another embodiment, the transistor 201 can include a gate dielectric 216. In one embodiment, the gate dielectric 216 can include a dielectric material. In another embodiment, the gate dielectric 216 can include silicon oxide. In another embodiment, the gate dielectric 216 can include a high-K dielectric material. In another embodiment, the high-K material, for example, hafnium oxide, tantalum oxide, titanium oxide, aluminum oxide, silicon dioxide, silicon nitride and the like. In one embodiment, an electro-glass (EG) can be used as the gate dielectric 216. In one embodiment, the gate dielectric 216 can include hexagonal boron nitride (HBN). In one embodiment, the gate dielectric 216 can be deposited using PVD, MBE, MOCVD, CVD, and/or ALD, and the like. In one embodiment, the gate dielectric 216 can have a thickness of approximately 1 nm to approximately 10 nm, with an example thickness of approximately 2 nm to approximately 4 nm.

In one embodiment, the transistor 201 can include a gate 218. In one embodiment, a gate 218 can be deposited on the gate dielectric 216. In another embodiment, the gate 218 can include a metal. In another embodiment, the gate 218 can include a transition metal. In one embodiment, the gate 218 can be used to tune the threshold voltage of the device. In one embodiment, gate 218 can titanium nitride, cobalt, tungsten, palladium, molybdenum, germanium, ruthenium, nickel, titanium silicide, and/or platinum. In one embodiment, the gate 218 can have a thickness of approximately 30 nm to approximately 100 nm, with an example thickness of approximately 40 nm to approximately 60 nm. In one embodiment, the gate 218 can be deposited using PVD, CVD, MOCVD, MBE and/or ALD, and the like.

Figure 3A:
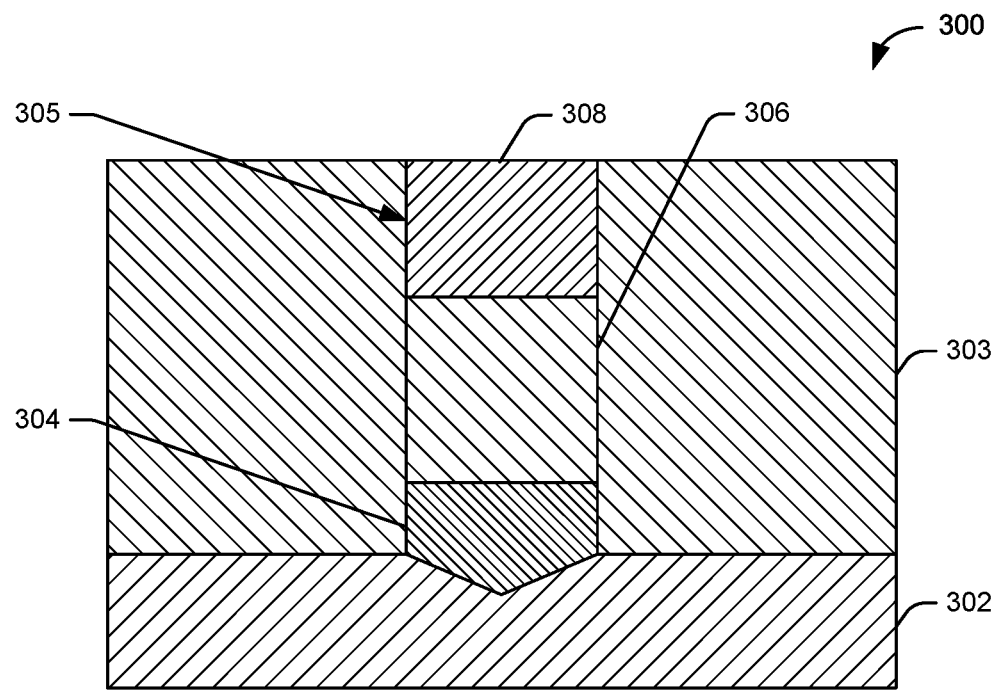
FIG. 3A shows a first view of a partial structure of the transistor, in the fabrication of a vertical TFET in accordance with one or more example embodiments of the disclosure.

FIG. 3A shows a first view of a partial structure of the transistor 300 in the fabrication of a vertical TFET in accordance with one or more example embodiments of the disclosure. In one embodiment, the transistor 300 can include a substrate 302. In one embodiment, the substrate 302 can refer to a solid (usually planar) substance onto which a layer of another substance is applied, and to which that second substance adheres. In another embodiment, the substrate 302 can include a silicon substrate. In one embodiment, the substrate 302 can include a p-doped silicon substrate. In one embodiment, the substrate 302 can be a thin slice of material such as silicon, silicon oxide, silicon dioxide, aluminum oxide, sapphire, an alloy of silicon and germanium, and/or indium phosphide (InP), and the like. In one embodiment, the substrate 302 can include a semiconductor material (for example, monocrystalline silicon, germanium, silicon germanium, SiGe, and/or a III-V materials based material (for example, gallium arsenide, GaAs), or any combination thereof). In an embodiment, the substrate 302 can include gallium antimonide (GaSb), silicon on insulator (SOI), germanium on insulator (GOI), or a III-V semiconductor material on silicon (III-V-OI).

In one embodiment, the transistor 300 can include an STI layer 303. In an embodiment, the STI layer 303 can also referred to as an isolation structure herein. In one embodiment, the STI layer 303 can include any material suitable to insulate adjacent devices and prevent current leakage. In one embodiment, the STI layer can provide field isolation regions that isolate one fin from other fins (not shown), for example, other fins on adjacent devices. In one embodiment, the STI layer 303 can include an oxide layer (for example, silicon dioxide), or any other electrically insulating layer. In one embodiment, the STI layer 303 can include an interlayer dielectric (ILD), such as silicon dioxide. In one embodiment, the STI layer 303 may include polyimide, epoxy, photodefinable materials (for example, benzocyclobutene, BCB), WPR-series materials, and/or spin-on-glass. In one embodiment, the STI layer 303 can include a low permittivity (low-k) ILD layer. In one embodiment, low-k can refer to dielectrics having a dielectric constant (permittivity k) lower than the permittivity of silicon dioxide. In one embodiment, the thickness of the STI layer 303 can be approximately 10 nm to approximately 300 nm, with an example thickness of approximately 30 nm to approximately 50 nm. In one embodiment, the buffer layer 204 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In one embodiment, the transistor 300 can include a buffer layer 304 (also referred to herein as a buffer material). In another embodiment, the buffer layer 304 can include a III-V semiconductor material layer. Such III-V semiconductor material layers can include those materials that are formed by combining group III elements (for example, including Al, Ga, In) with group V elements (for example, including N, P, As, Sb). For example, some III-V semiconductor materials can include, but not be limited to, GaAs, InP GaP and GaN. In one embodiment, the buffer layer 304 can include any material suitable to insulate adjacent devices and prevent current leakage. In one embodiment, the buffer layer 304 can include an oxide layer (for example, silicon dioxide), or any other electrically insulating layer. In one embodiment, the buffer layer 304 can include an interlayer dielectric (ILD), such as silicon dioxide. In one embodiment, the buffer layer 304 may include polyimide, epoxy, photodefinable materials (for example, benzocyclobutene, BCB), WPR-series materials, and/or spin-on-glass. In one embodiment, the buffer layer 304 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 304 can be approximately 10 nm to approximately 300 nm, with an example thickness of approximately 30 nm to approximately 50 nm. In one embodiment, the buffer layer 304 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In an embodiment, the buffer layer 304 can be patterned and etched to form trenches, such as trench 305, using one of the patterning and etching techniques known to one of ordinary skill in the art. In one embodiment, the trench 305 can have a depth D of approximately 50 nm to about 300 nm and a width W of approximately 5 nm to about 20 nm. In one embodiment, an aspect ratio of the trench 305 (D/W) can determine the thickness of the buffer layers deposited through that trench. In another embodiment, the higher the D/W ratio of the trench, the thicker the buffer layer 304 can be.

In one embodiment, the transistor 300 can include a source 306. In another embodiment, the source 306 can include a p-doped gallium antimonide (GaSb) layer. In one embodiment, the source 306 can further include a p-doped aluminum anitomodnide (AlSb) and/or an indium antimonide (InSb) layer. In another embodiment, the source 306 can include a nonreactive metal. In one embodiment, the source 306 can include tungsten, titanium nitride, aluminum, titanium, tantalum nitride, cobalt, and/or nickel. In another embodiment, the source 306 can include an p-doped indium gallium arsenide layer. In one embodiment, the source 306 can include silicon. In another embodiment, the silicon material may be p-doped. In another embodiment, the source 306 can include doped or undoped black phosphorous, titanium, tantalum, cobalt, molybdenum, titanium nitride, tantalum nitride, hafnium, copper, gadolinium, and the like. In one embodiment, the source 306 can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 306. In one embodiment, source can include gettering materials. In one embodiment, the gettering materials can getter sulfur. In one embodiment, the source 306 can be doped, for example, by creating vacancies of sulfur and selenium. In one embodiment, the source 306 can be doped with oxygen vacancies if the source comprises an oxide or a multi-material system. In another embodiment, the source can be doped with phosphorous, boron, aluminum, tin, hafnium, titanium, copper, indium, and/or arsenic if the source 306 comprises a non-oxide a single-material semiconductor. In another embodiment, the source 306 can be approximately 1 nanometer to approximately 100 nm thick, with example thicknesses of approximately 10 nm to approximately 50 nm thick. In one embodiment, the source 306 can be deposited using PVD, CVD, MOCVD, MBE, and/or ALD, and the like.

In one embodiment, the transistor 300 can include a channel 308. In another embodiment, the channel 308 can include an unintentionally doped (UID) indium arsenide (InAs) layer. In one embodiment, UID can refer to dopants that may be integrated into a layer, for example, during the fabrication of that layer, from the environment and/or processes that the layer is exposed to, often in an uncontrolled manner. In one embodiment, the channel 308 can include an amorphous oxide semiconductor. In another embodiment, the channel 308 can include a zinc oxide (ZnO), an indium gallium zinc oxide (IGZO), an indium tin oxide (ITO) or an antimony oxide material and/or the like. In one embodiment, the channel 308 may include a material that has a wide-band gap with respect to silicon (approximately 1.1 eV). In one embodiment, the channel 308 can include black phosphorous, amorphous silicon, germanium, carbon nanotube, and the like. In one embodiment, the channel 308 can include silicon, germanium, indium gallium arsenide (InGaAs), gallium nitride (GaN), amorphous semiconductors such as amorphous silicon (a-Si), amorphous germanium (a-Ge), polycrystalline germanium, polycrystalline silicon, and/or polycrystalline InGaAs, and the like. In one embodiment, the channel thickness can depend on the technology used to fabricate the transistor. In another embodiment, the channel 308 can be approximately 3 nm to approximately 50 nm thick, with example thicknesses of approximately 5 nm to approximately 20 nm. In one embodiment, the channel 308 can be deposited using PVD, MBE, MOCVD, CVD, and/or ALD, and the like.

Figure 3B:
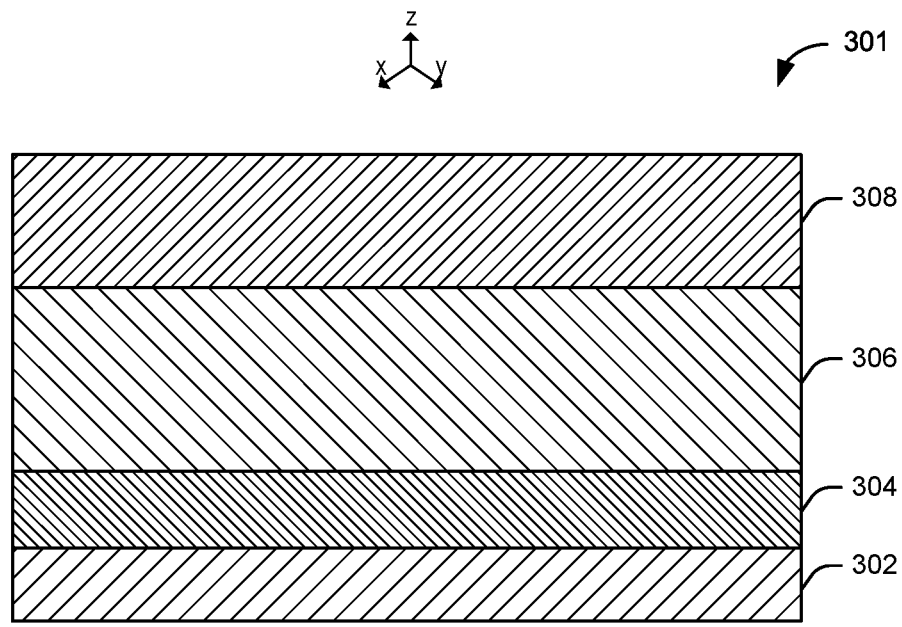
FIG. 3B shows a second view of a partial structure of a transistor in the fabrication of a vertical TFET, in accordance with one or more example embodiments of the disclosure.

FIG. 3B shows a second view of a partial structure of a transistor 301 using the fabrication of a vertical TFET in accordance with one or more example embodiments of the disclosure. In one embodiment, transistor 301 can include a substrate 302. In one embodiment, the substrate 302 can refer to a solid (usually planar) substance onto which a layer of another substance is applied, and to which that second substance adheres. In another embodiment, the substrate 302 can include a silicon substrate. In one embodiment, the substrate 302 can include a p-doped silicon substrate. In one embodiment, the substrate 302 can be a thin slice of material such as silicon, silicon oxide, silicon dioxide, aluminum oxide, sapphire, an alloy of silicon and germanium, and/or indium phosphide (InP), and the like. In one embodiment, the substrate 302 can include a semiconductor material (for example, monocrystalline silicon, germanium, silicon germanium, SiGe, and/or a III-V materials based material (for example, gallium arsenide, GaAs), or any combination thereof).

In one embodiment, the transistor 301 can include a buffer layer 304. In another embodiment, the buffer layer 304 can include a III-V semiconductor material layer. Such III-V semiconductor material layers can include those materials that are formed by combining group III elements (for example, including Al, Ga, In) with group V elements (for example, including N, P, As, Sb). For example, some III-V semiconductor materials can include, but not be limited to, GaAs, InP GaP and GaN. In one embodiment, the buffer layer 304 can include any material suitable to insulate adjacent devices and prevent current leakage. In one embodiment, the buffer layer 304 can include an oxide layer (for example, silicon dioxide), or any other electrically insulating layer. In one embodiment, the buffer layer 304 can include an interlayer dielectric (ILD), such as silicon dioxide. In one embodiment, the buffer layer 304 may include polyimide, epoxy, photodefinable materials (for example, benzocyclobutene, BCB), WPR-series materials, and/or spin-on-glass. In one embodiment, the buffer layer 304 can include a low permittivity (low-k) ILD layer. In one embodiment, low-k can refer to dielectrics having a dielectric constant (permittivity k) lower than the permittivity of silicon dioxide. In one embodiment, the thickness of the buffer layer 304 can be approximately 10 nm to approximately 300 nm, with an example thickness of approximately 30 nm to approximately 50 nm. In one embodiment, the buffer layer 304 can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In one embodiment, the transistor 301 can include a source 306. In another embodiment, the source 306 can include a p-doped gallium antimonide (GaSb) layer. In one embodiment, the source 306 can further include a p-doped aluminum anitomodnide (AlSb) and/or an indium antimonide (InSb) layer. In another embodiment, the source 306 can include a nonreactive metal. In one embodiment, the source 306 can include tungsten, titanium nitride, aluminum, titanium, tantalum nitride, cobalt, and/or nickel. In another embodiment, the source 306 can include an p-doped indium gallium arsenide layer. In one embodiment, the source 306 can include silicon. In another embodiment, the silicon material may be p-doped. In another embodiment, the source 306 can include doped or undoped black phosphorous, titanium, tantalum, cobalt, molybdenum, titanium nitride, tantalum nitride, hafnium, copper, gadolinium, and the like. In one embodiment, the source 206 can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source 306. In one embodiment, source 306 can include gettering materials. In one embodiment, the gettering materials can getter sulfur. In one embodiment, the source 306 can be doped, for example, by creating vacancies of sulfur and selenium. In one embodiment, the source 306 can be doped with oxygen vacancies if the source comprises an oxide or a multi-material system. In another embodiment, the source can be doped with phosphorous, boron, aluminum, tin, hafnium, titanium, copper, indium, and/or arsenic if the source 306 comprises a non-oxide a single-material semiconductor. In another embodiment, the source 306 can be approximately 1 nanometer to approximately 100 nm thick, with example thicknesses of approximately 10 nm to approximately 50 nm thick. In one embodiment, the source 306 can be deposited using PVD, CVD, MOCVD, MBE, and/or ALD, and the like.

In one embodiment, the transistor 301 can include a channel 308. In another embodiment, the channel 308 can include an unintentionally doped indium arsenide layer. In one embodiment, the channel 308 can include an amorphous oxide semiconductor. In another embodiment, the channel 308 can include a zinc oxide (ZnO), an indium gallium zinc oxide (IGZO), an indium tin oxide (ITO) or an antimony oxide material and/or the like. In one embodiment, the channel 308 may include a material that has a wide-band gap with respect to silicon (approximately 1.1 eV). In one embodiment, the channel 308 can include black phosphorous, amorphous silicon, germanium, carbon nanotube, and the like. In one embodiment, the channel 308 can include silicon, germanium, indium gallium arsenide (InGaAs), gallium nitride (GaN), amorphous semiconductors such as amorphous silicon (a-Si), amorphous germanium (a-Ge), polycrystalline germanium, polycrystalline silicon, and/or polycrystalline InGaAs, and the like. In one embodiment, the channel thickness can depend on the technology used to fabricate the transistor. In another embodiment, the channel 308 can be approximately 3 nm to approximately 50 nm thick, with example thicknesses of approximately 5 nm to approximately 20 nm. In one embodiment, the channel 308 can be deposited using PVD, MBE, MOCVD, CVD, and/or ALD, and the like.

Figure 4A:
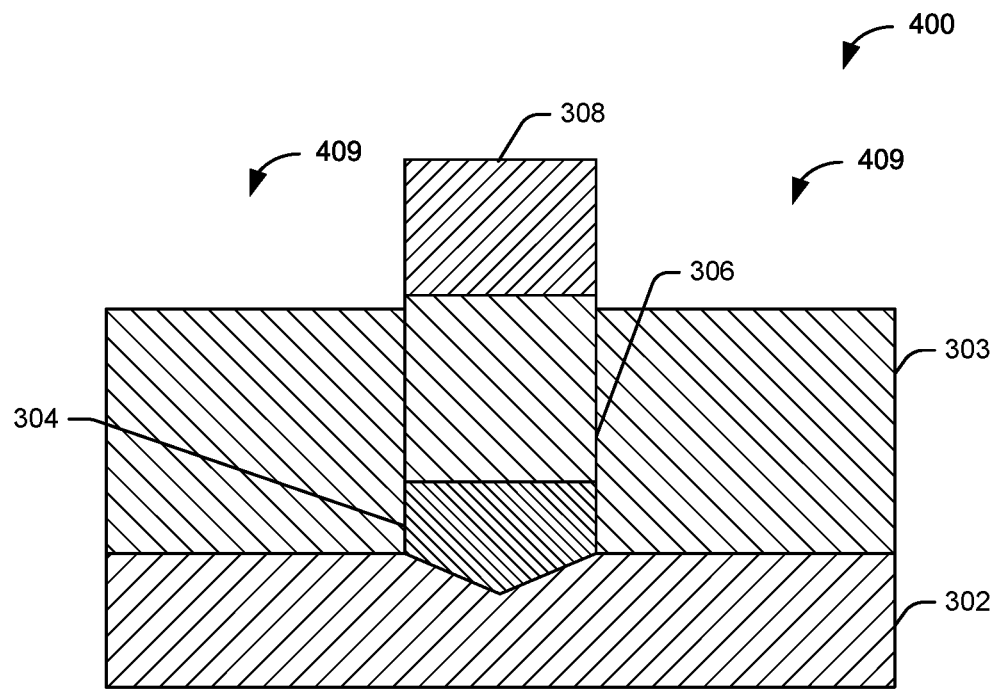
FIG. 4A shows a first view of a partial structure of the transistor in the fabrication of a vertical TFET, in accordance with one or more example embodiments of the disclosure.

FIG. 4A shows a first view of a partial structure of the transistor 400 in the fabrication of a vertical TFET in accordance with one or more example embodiments of the disclosure. In one embodiment, the transistor 400 can include a recess 409 in the STI layer 303 that can be formed by a removal a portion of the STI layer 303. In one embodiment, the removal of the portion of the STI layer 303 can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the STI layer 303.

In various embodiments, the transistor 400 can include the layers described previously in connection with FIGS. 3A and 3B. For example, the transistor 401 can include a substrate 302, a buffer layer 304, a source 306, and a channel 308. For further description of the various layers, including layer thicknesses, compositions, and/or fabrication techniques, please refer to the relevant description provided in connection with FIGS. 3A and 3B.

Figure 4B:
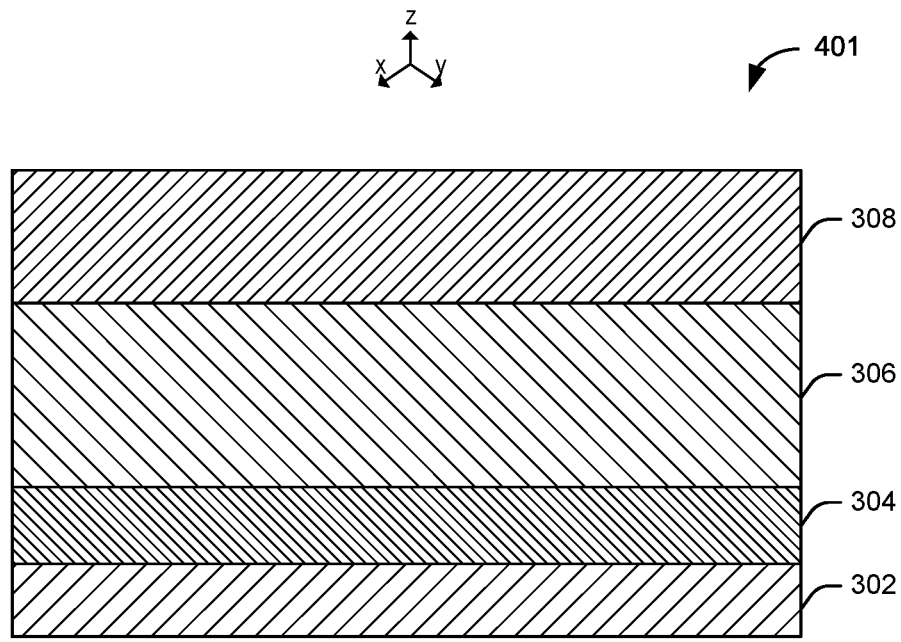
FIG. 4B shows a second view of a partial structure of the transistor in the fabrication of a vertical TFET, in accordance with one or more example embodiments of the disclosure.

FIG. 4B shows a second view of a partial structure of the transistor 401 in the fabrication of a vertical TFET in accordance with one or more example embodiments of the disclosure. In various embodiments, the transistor 401 can include the layers described previously in connection with FIGS. 3A and 3B, and FIG. 4A. For example, the transistor 401 can include a substrate 302, a buffer layer 304, an STI 303, a source 306, and a channel 308. For further description of the various layers, including layer thicknesses, compositions, and/or fabrication techniques, please refer to the relevant description provided in connection with FIGS. 3A and 3B and FIG. 4A.

Figure 5A:
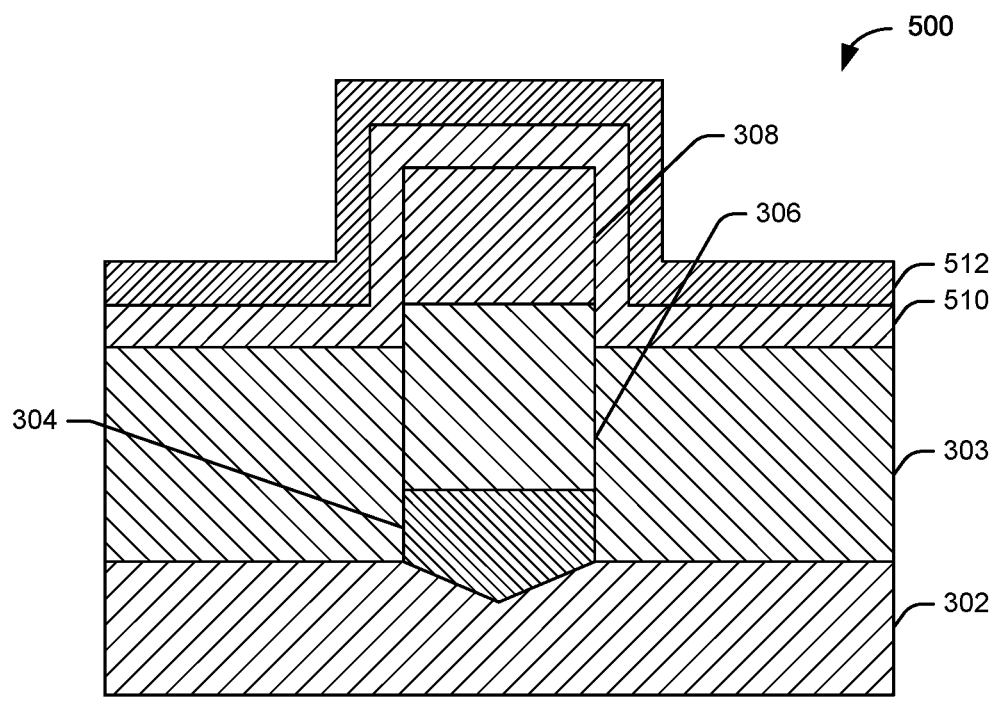
FIG. 5A shows a first view of a partial structure of the transistor in the fabrication of a vertical TFET, in accordance with one or more example embodiments of the disclosure.

FIG. 5A shows a first view of a partial structure of the transistor 500 in the fabrication of a vertical TFET in accordance with one or more example embodiments of the disclosure. In one embodiment, the transistor 500 can include a gate dielectric 510. In one embodiment, the gate dielectric 510 can include a dielectric material. In another embodiment, the gate dielectric 510 can include silicon oxide. In another embodiment, the gate dielectric 510 can include a high-K dielectric material. In another embodiment, the high-K material, for example, hafnium oxide, tantalum oxide, titanium oxide, aluminum oxide, silicon dioxide, silicon nitride and the like. In one embodiment, an electro-glass (EG) can be used as the gate dielectric 510. In one embodiment, the gate dielectric 510 can include hexagonal boron nitride (HBN). In one embodiment, the gate dielectric 510 can be deposited using PVD, MBE, MOCVD, CVD, and/or ALD, and the like. In one embodiment, the gate dielectric 510 can have a thickness of approximately 1 nm to approximately 10 nm, with an example thickness of approximately 2 nm to approximately 4 nm.

In another embodiment, the transistor 500 can include a gate 512. In one embodiment, a gate 512 can be deposited on the gate dielectric 512. In another embodiment, the gate 512 can include a metal. In another embodiment, the gate 512 can include a transition metal. In one embodiment, the gate 512 can be used to tune the threshold voltage of the device. In one embodiment, gate 512 can titanium nitride, cobalt, tungsten, palladium, molybdenum, germanium, ruthenium, nickel, titanium silicide, and/or platinum. In one embodiment, the gate 512 can be deposited using PVD, CVD, MOCVD, MBE and/or ALD, and the like. In one embodiment, the gate 512 can have a thickness of approximately 30 nm to approximately 100 nm, with an example thickness of approximately 40 nm to approximately 60 nm.

In various embodiments, the transistor 500 can include the layers described previously in connection with FIGS. 3A and 3B, and FIGS. 4A and 4B. For example, the transistor 500 can include a substrate 302, a buffer layer 304, an STI 303, a source 306, a channel 308, and a drain 312. For further description of the various layers, including layer thicknesses, compositions, and/or fabrication techniques, please refer to the relevant description provided in connection with FIGS. 3A and 3B and FIGS. 4A and 4B.

Figure 5B:
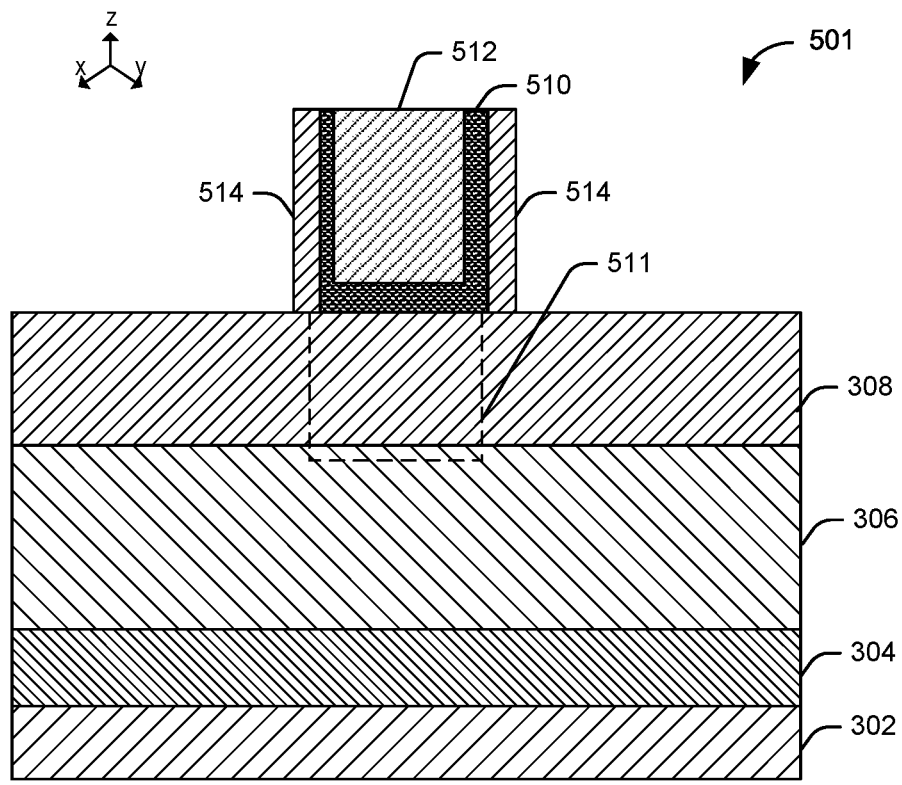
FIG. 5B shows a second view of a partial structure of the transistor in the fabrication of a vertical TFET, in accordance with one or more example embodiments of the disclosure.

FIG. 5B shows a second view of a partial structure of the transistor 501 in the fabrication of a vertical TFET in accordance with one or more example embodiments of the disclosure. In an embodiment, the spacers 514 can serve to provide electrical insulation between the gate 512 and the source and/or the drain (for example, source 306 and drain 618, shown and described in connection with FIG. 6). In one embodiment, the spacers 514 can include silicon oxide or silicon nitride. The spacer can be serve to prevent the source and/or drain from making electrical contact to the gate 512. In one embodiment, label 511 serves as a visual indication of the wrap-around gate structure of the vertical TFET.

In one embodiment, the spacers 514 can have a triangle shape (not shown). This can be due, for example, to an etching step involved in the fabrication of the spacers 514. That is, the spacers 514 may be first deposited as a blanket layer, and then an etch can be used to remove a portion of the insulating spacers 514. In one embodiment, the etch can be a directional etch. In another embodiment, the etch may not etch straight downward (in the negative z direction); rather, the etch may have a slight slant and etch more of the top of the spacers 514 as well, giving rise to the triangular shape of the spacers 514.

In various embodiments, the transistor 501 can include the layers described previously in connection with FIGS. 3A and 3B, and FIGS. 4A and 4B. For example, the transistor 501 can include a substrate 302, a buffer layer 304, an STI 303, a source 306, and a channel 308. For further description of the various layers, including layer thicknesses, compositions, and/or fabrication techniques, please refer to the relevant description provided in connection with FIGS. 3A and 3B and FIGS. 4A and 4B.

Figure 6:
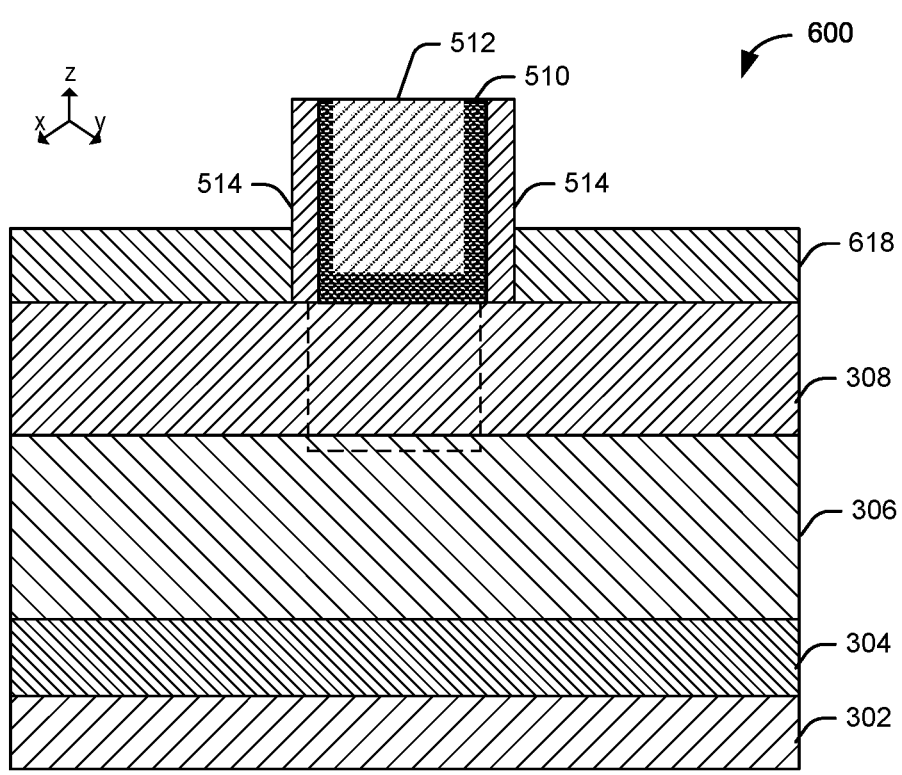
FIG. 6 shows one view of a partial structure of the transistor in the fabrication of a vertical TFET, in accordance with one or more example embodiments of the disclosure.

FIG. 6 shows a view of a partial structure of the transistor 600 in the fabrication of a vertical TFET in accordance with one or more example embodiments of the disclosure. In one embodiment, the transistor 600 can include a drain 618. In another embodiment, the drain 212 can include an n-doped indium arsenide layer. In another embodiment, the drain 618 can include a nonreactive metal. In one embodiment, the drain 618 can include tungsten and/or titanium nitride, aluminum, titanium, tantalum nitride, cobalt, and/or nickel material. In another embodiment, the drain 618 can include an n-doped indium gallium arsenide layer. In one embodiment, the drain 618 can include silicon. In another embodiment, the silicon material may be n-doped. In another embodiment, the drain 618 can include doped or undoped black phosphorous, titanium, tantalum, cobalt, molybdenum, titanium nitride, tantalum nitride, hafnium, copper, gadolinium, and the like. In one embodiment, the drain 618 can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating excess electron in the drain 618. In another embodiment, the drain 618 can be doped with phosphorous, boron, aluminum, tin, hafnium, titanium, copper, indium, and/or arsenic if the drain 618 comprises a non-oxide a single-material semiconductor. In another embodiment, the drain 618 can be approximately 1 nanometer to approximately 100 nm thick, with example thicknesses of approximately 10 nm to approximately 50 nm thick. In one embodiment, the drain 618 can be deposited using PVD, CVD, MOCVD, MBE, and/or ALD, and the like.

In one embodiment, to reduce gate-induced drain leakage, drain 618 can have a wider band gap than the material used for channel 308. In one embodiment, for example, in an embodiment used in connection with homojunction TFETs, drain 618, channel 308, and source 306 can include the same materials, while source 618 is n-doped, channel 308 is unintentionally doped, and drain 306 is p-doped.

In various embodiments, the transistor 600 can include the layers described previously in connection with FIGS. 3A and 3B, FIGS. 4A and 4B, and FIGS. 5A and 5B. For example, the transistor 600 can include a substrate 302, a buffer layer 304, an STI 303, a source 306, a channel 308, a drain 312, a gate dielectric 510, a gate 512, and spacers 514. For further description of the various layers, including layer thicknesses, compositions, and/or fabrication techniques, please refer to the relevant description provided in connection with FIGS. 3A and 3B, FIGS. 4A and 4B, and FIG. 5A and FIG. 5B.

Figure 7:
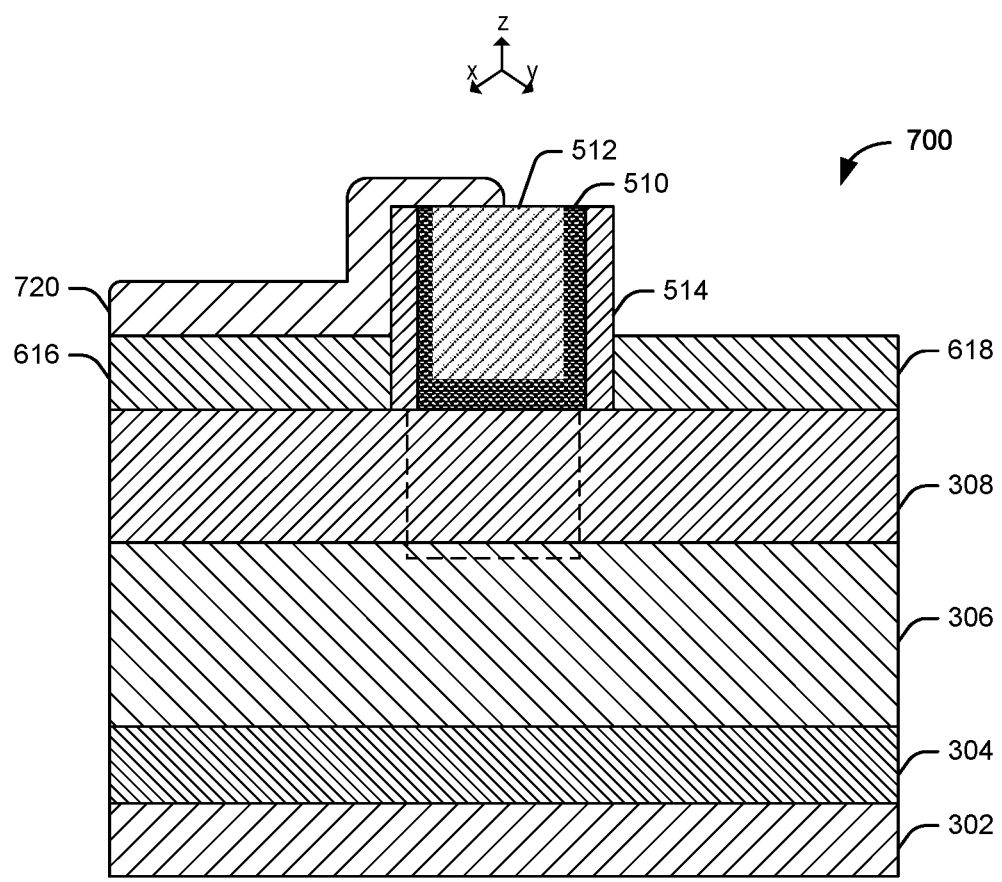
FIG. 7 shows another view of a partial structure of the transistor in the fabrication of a vertical TFET, in accordance with one or more example embodiments of the disclosure.

FIG. 7 shows a view of a partial structure of the transistor 700 in the fabrication of a vertical TFET in accordance with one or more example embodiments of the disclosure. In one embodiment, the transistor 700 can include an oxide 720. In one embodiment, the oxide 720 can include an interlayer dielectric (ILD) material. In another embodiment, ILD can include silicon dioxide ($SiO_2$), or a low-K material. In one embodiment, the oxide 720 can be deposited using PVD, CVD, MOCVD, and/or ALD, and the like.

In various embodiments, the transistor 700 can include the layers described previously in connection with FIGS. 3A and 3B, FIGS. 4A and 4B, FIGS. 5A and 5B, and FIG. 6. For example, the transistor 700 can include a substrate 302, a buffer layer 304, an STI 303, a source 306, a channel 308, a gate dielectric 510, a gate 512, spacers 514, and drain 618. For further description of the various layers, including layer thicknesses, compositions, and/or fabrication techniques, please refer to the relevant description provided in connection with FIGS. 3A and 3B, FIGS. 4A and 4B, FIG. 5A and FIG. 5B, and FIG. 6.

Figure 8:
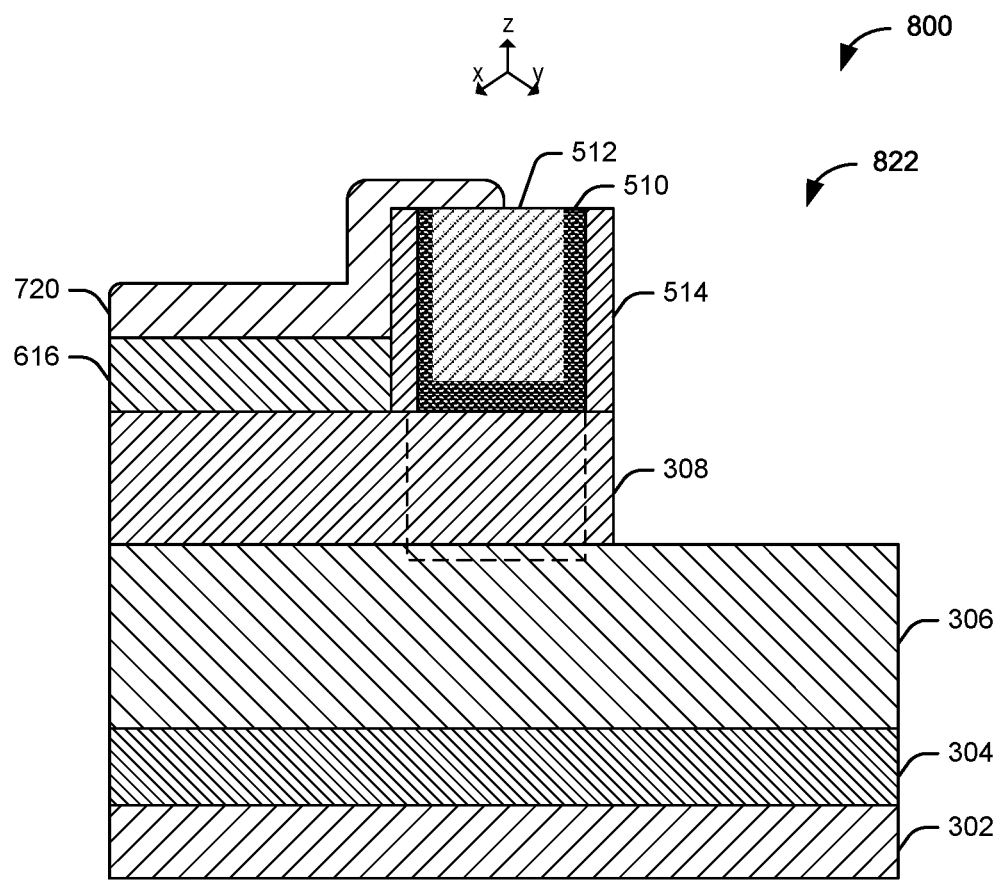
FIG. 8 shows yet another view of a partial structure of the transistor in the fabrication of a vertical TFET, in accordance with one or more example embodiments of the disclosure.

FIG. 8 shows a view of a partial structure of the transistor 800 in the fabrication of a vertical TFET in accordance with one or more example embodiments of the disclosure. In one embodiment, the transistor 800 can include a recess 822 that can be in the channel 308, and that that can be formed by the removal of a portion of the drain 618 and a portion of the channel 308. In one embodiment, the removal of the portion of the drain 618 and a portion of the channel 303 can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the drain 618 and a portion of the channel 303.

In various embodiments, the transistor 800 can include the layers described previously in connection with FIGS. 3A and 3B, FIGS. 4A and 4B, FIGS. 5A and 5B, FIG. 6, and FIG. 7. For example, the transistor 800 can include a substrate 302, a buffer layer 304, an STI 303, a source 306, a channel 308, a gate dielectric 510, a gate 512, spacers 514, drain 618, and oxide 720. For further description of the various layers, including layer thicknesses, compositions, and/or fabrication techniques, please refer to the relevant description provided in connection with FIGS. 3A and 3B, FIGS. 4A and 4B, FIG. 5A and FIG. 5B, FIG. 6, and FIG. 7.

Figure 9:
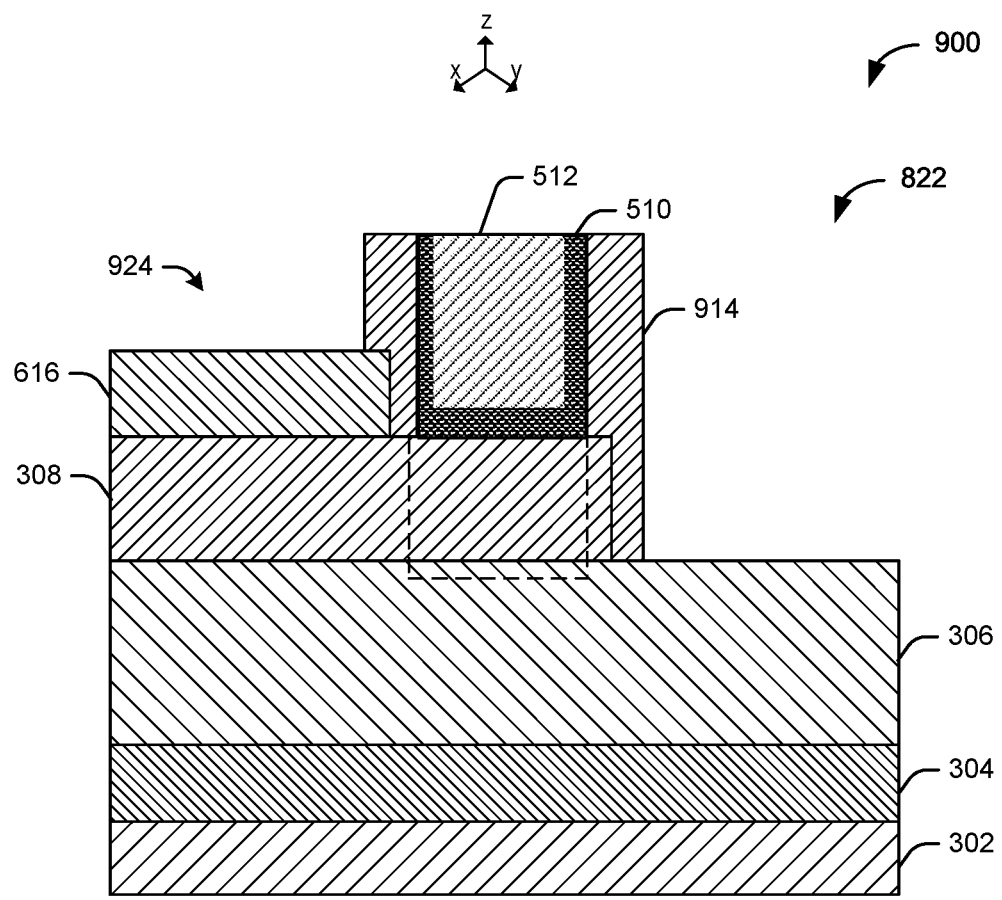
FIG. 9 shows another of a partial structure of the transistor in the fabrication of a vertical TFET, in accordance with one or more example embodiments of the disclosure.

FIG. 9 shows a view of a partial structure of the transistor 900 in the fabrication of a vertical TFET in accordance with one or more example embodiments of the disclosure. In one embodiment, the transistor 900 can include a recess 924 that can be formed by the removal of one of the oxide 720. In one embodiment, the removal of the oxide 720 can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the one of the oxide 720.

In one embodiment, spacers 914 can be thicker than spacers 514 as further shown and described in connection with FIG. 8. The thicker spacers 914 can be achieved by re-depositing a spacer (similar, but not necessarily identical to, spacers 514 as shown and described in connection with FIG. 5) and then performing an etching step on the spacer. In one embodiment, the thicker spacers 914 can serve to reduce the likelihood of a shorted ground to source connection and/or a shorted ground to drain connection.

In various embodiments, the transistor 900 can include the layers described previously in connection with FIGS. 3A and 3B, FIGS. 4A and 4B, FIGS. 5A and 5B, and FIG. 6. For example, the transistor 900 can include a substrate 302, a buffer layer 304, an STI 303, a source 306, a channel 308, a drain 312, a gate dielectric 510, a gate 512, spacers 514, drain 618, and oxide 720. For further description of the various layers, including layer thicknesses, compositions, and/or fabrication techniques, please refer to the relevant description provided in connection with FIGS. 3A and 3B, FIGS. 4A and 4B, FIG. 5A and FIG. 5B, and FIG. 6.

Figure 10:
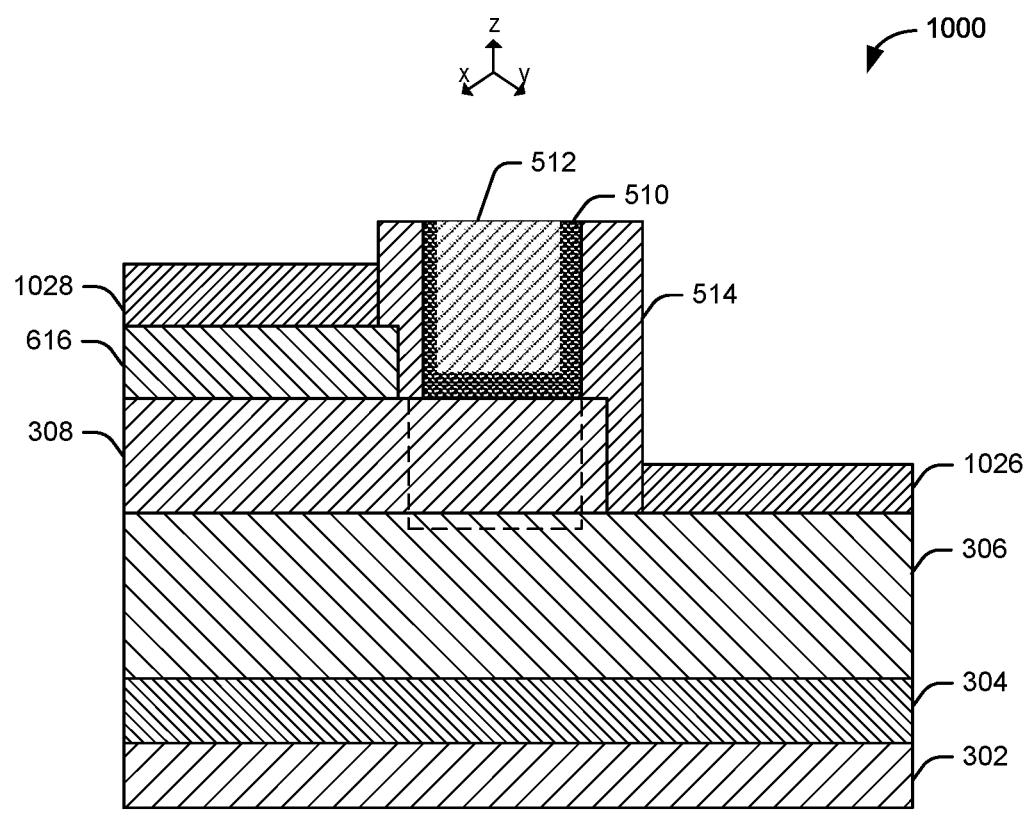
FIG. 10 shows a view of a partial structure of the transistor in the fabrication of a vertical TFET, in accordance with one or more example embodiments of the disclosure.

FIG. 10 shows a view of a partial structure of the transistor 1000 in the fabrication of a vertical TFET in accordance with one or more example embodiments of the disclosure. In one embodiment, the transistor 1000 can include a source contact 1026. In one embodiment, the source contact 1026 can include a metal. In one embodiment, the source contact 1026 can include gold, copper, silver, aluminum, zinc, tin, platinum, titanium, titanium nitride, tantalum nitride, silicide, tungsten, palladium, molybdenum, germanium, ruthenium, nickel any of the like The source contact 1026 can include any alloys of such materials. In one embodiment, the source contact 1026 can have a thickness of approximately 2 nm to approximately 100 nm, with example thicknesses of approximately 5 nm to approximately 20 nm. In one embodiment, the source contact 1026 can be deposited using PVD, CVD, MOCVD, MBE, and/or ALD, and the like.

In one embodiment, the transistor 1000 can include a drain contact 1028. In one embodiment, the drain contact 1028 can include a metal. In one embodiment, the metal can include gold, copper, silver, aluminum, zinc, tin, platinum, and any of the like. In one embodiment, the drain contact 1028 can include gold, copper, silver, aluminum, zinc, tin, platinum, titanium, titanium nitride, tantalum nitride, silicide, tungsten, palladium, molybdenum, germanium, ruthenium, nickel any of the like. The drain contact 1028 can include any alloys of such materials. In one embodiment, the drain contract 1028 can have a thickness of approximately 2 nm to approximately 100 nm, with example thicknesses of approximately 5 nm to approximately 20 nm. In one embodiment, the drain contract 1028 can be deposited using PVD, CVD, MOCVD, MBE, and/or ALD, and the like.

In various embodiments, the transistor 1000 can include the layers described previously in connection with FIGS. 3A and 3B, FIGS. 4A and 4B, FIGS. 5A and 5B, and FIG. 6. For example, the transistor 1000 can include a substrate 302, a buffer layer 304, an STI 303, a source 306, a channel 308, a drain 312, a gate dielectric 510, a gate 512, spacers 514, drain 618, and oxide 720. For further description of the various layers, including layer thicknesses, compositions, and/or fabrication techniques, please refer to the relevant description provided in connection with FIGS. 3A and 3B, FIGS. 4A and 4B, FIG. 5A and FIG. 5B, and FIG. 6.

Figure 11:
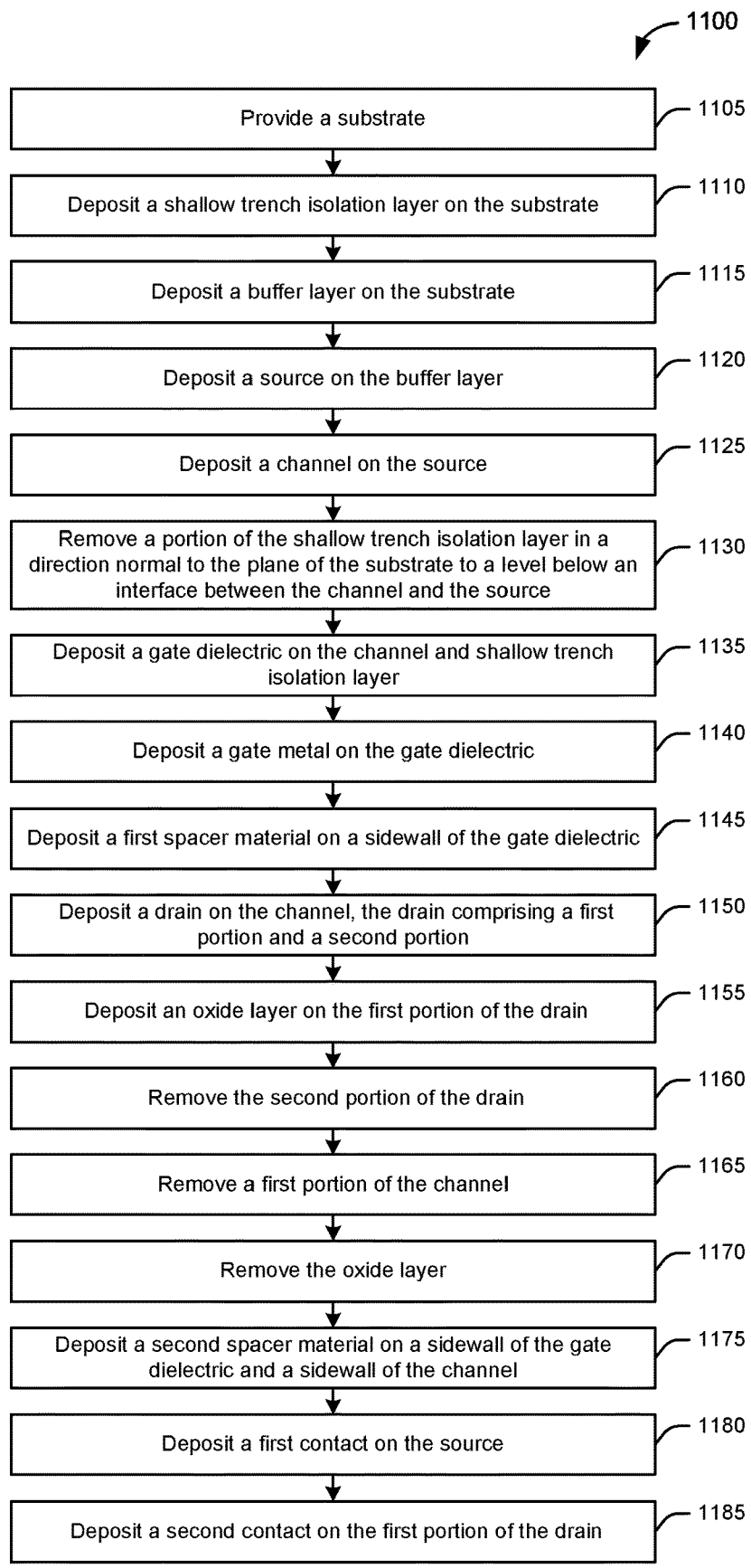
FIG. 11 shows a diagram of an example flow diagram for the fabrication of a vertical TFET, in accordance with example embodiments of the disclosure.

FIG. 11 shows a diagram of an example flow diagram for the fabrication of a vertical TFET, in accordance with example embodiments of the disclosure. In block 1105, a substrate can be provided. In one embodiment, the substrate can refer to a solid (usually planar) substance onto which a layer of another substance is applied, and to which that second substance adheres. In another embodiment, the substrate can include a silicon substrate. In one embodiment, the substrate can include a p-doped silicon substrate. In one embodiment, the substrate can be a thin slice of material such as silicon, silicon oxide, silicon dioxide, aluminum oxide, sapphire, an alloy of silicon and germanium, and/or indium phosphide (InP), and the like. In one embodiment, the substrate can include a semiconductor material (for example, monocrystalline silicon, germanium, silicon germanium, SiGe, and/or a III-V materials based material (for example, gallium arsenide, GaAs), or any combination thereof).

In block 1110, a shallow trench isolation layer can be deposited on the substrate. In one embodiment, the STI layer can include any material suitable to insulate adjacent devices and prevent current leakage. In one embodiment, the STI layer can provide field isolation regions that isolate one fin from other fins (not shown), for example, other fins on adjacent devices. In one embodiment, the STI layer can include an oxide layer (for example, silicon dioxide), or any other electrically insulating layer. In one embodiment, the STI layer can include an interlayer dielectric (ILD), such as silicon dioxide. In one embodiment, the STI layer may include polyimide, epoxy, photodefinable materials (for example, benzocyclobutene, BCB), WPR-series materials, and/or spin-on-glass. In one embodiment, the STI layer can include a low permittivity (low-k) ILD layer. In one embodiment, low-k can refer to dielectrics having a dielectric constant (permittivity k) lower than the permittivity of silicon dioxide. In one embodiment, the thickness of the STI layer can be approximately 10 nm to approximately 300 nm, with an example thickness of approximately 30 nm to approximately 50 nm. In one embodiment, the buffer layer can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In block 1115, a buffer layer can be deposited on the substrate. In another embodiment, the buffer layer can include a III-V semiconductor material layer. Such III-V semiconductor material layers can include those materials that are formed by combining group III elements (for example, including Al, Ga, In) with group V elements (for example, including N, P, As, Sb). For example, some III-V semiconductor materials can include, but not be limited to, GaAs, InP GaP and GaN. In one embodiment, the buffer layer can include any material suitable to insulate adjacent devices and prevent current leakage. In one embodiment, the buffer layer can include an oxide layer (for example, silicon dioxide), or any other electrically insulating layer. In one embodiment, the buffer layer can include an interlayer dielectric (ILD), such as silicon dioxide. In one embodiment, the buffer layer may include polyimide, epoxy, photodefinable materials (for example, benzocyclobutene, BCB), WPR-series materials, and/or spin-on-glass. In one embodiment, the buffer layer can include a low permittivity (low-k) ILD layer. In one embodiment, low-k can refer to dielectrics having a dielectric constant (permittivity k) lower than the permittivity of silicon dioxide. In one embodiment, the thickness of the buffer layer can be approximately 10 nm to approximately 300 nm, with an example thickness of approximately 30 nm to approximately 50 nm. In one embodiment, the buffer layer can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In an embodiment, the buffer layer can be patterned and etched to form trenches, such as trench, using one of the patterning and etching techniques known to one of ordinary skill in the art. In one embodiment, the trench can have a depth D of approximately 50 nm to about 300 nm and a width W of approximately 5 nm to about 20 nm. In one embodiment, an aspect ratio of the trench (D/W) can determine the thickness of the buffer layers deposited through that trench. In another embodiment, the higher the D/W ratio of the trench, the thicker the buffer layer can be.

In block 1120, a source can be deposited on the buffer layer. In another embodiment, the source can include a p-doped gallium antimonide (GaSb) layer. In one embodiment, the source can further include a p-doped aluminum anitomodnide (AlSb) and/or an indium antimonide (InSb) layer. In another embodiment, the source can include a nonreactive metal. In one embodiment, the source can include tungsten, titanium nitride, aluminum, titanium, tantalum nitride, cobalt, and/or nickel. In another embodiment, the source can include an p-doped indium gallium arsenide layer. In one embodiment, the source can include silicon. In another embodiment, the silicon material may be p-doped. In another embodiment, the source can include doped or undoped black phosphorous, titanium, tantalum, cobalt, molybdenum, titanium nitride, tantalum nitride, hafnium, copper, gadolinium, and the like. In one embodiment, the source can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating electron vacancies in the source. In one embodiment, source can include gettering materials. In one embodiment, the gettering materials can getter sulfur. In one embodiment, the source can be doped, for example, by creating vacancies of sulfur and selenium. In one embodiment, the source can be doped with oxygen vacancies if the source comprises an oxide or a multi-material system. In another embodiment, the source can be doped with phosphorous, boron, aluminum, tin, hafnium, titanium, copper, indium, and/or arsenic if the source comprises a non-oxide a single-material semiconductor. In another embodiment, the source can be approximately 1 nm to approximately 100 nm thick, with example thicknesses of approximately 10 nm to approximately 50 nm thick. In one embodiment, the source can be deposited using PVD, CVD, MOCVD, MBE, and/or ALD, and the like.

In block 1125, a channel can be deposited on the source. In another embodiment, the channel can include an unintentionally doped indium arsenide layer. In one embodiment, the channel can include an amorphous oxide semiconductor. In another embodiment, the channel can include a zinc oxide (ZnO), an indium gallium zinc oxide (IGZO), an indium tin oxide (ITO) or an antimony oxide material and/or the like. In one embodiment, the channel may include a material that has a wide-band gap with respect to silicon (approximately 1.1 eV). In one embodiment, the channel can include black phosphorous, amorphous silicon, germanium, carbon nanotube, and the like. In one embodiment, the channel can include silicon, germanium, indium gallium arsenide (InGaAs), gallium nitride (GaN), amorphous semiconductors such as amorphous silicon (a-Si), amorphous germanium (a-Ge), polycrystalline germanium, polycrystalline silicon, and/or polycrystalline InGaAs, and the like. In another embodiment, the channel can be approximately 3 nm to approximately 50 nm thick, with example thicknesses of approximately 5 nm to approximately 20 nm. In one embodiment, the channel can be deposited using PVD, MBE, MOCVD, CVD, and/or ALD, and the like.

In block 1130, a portion of the shallow trench isolation layer in a direction normal to the plane of the substrate can be removed to a level below an interface between the channel and the source. In one embodiment, the removal of the portion of the shallow trench isolation layer can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the portion of the shallow trench isolation layer.

In block 1135, a gate dielectric can be deposited on the channel and shallow trench isolation layer. In one embodiment, the gate dielectric can include a dielectric material. In another embodiment, the gate dielectric can include silicon oxide. In another embodiment, the gate dielectric can include a high-K dielectric material. In another embodiment, the high-K material, for example, hafnium oxide, tantalum oxide, titanium oxide, aluminum oxide, silicon dioxide, silicon nitride and the like. In one embodiment, an electroglass (EG) can be used as the gate dielectric. In one embodiment, the gate dielectric can include hexagonal boron nitride (HBN). In one embodiment, the gate dielectric can be deposited using PVD, MBE, MOCVD, CVD, and/or ALD, and the like. In one embodiment, the gate dielectric can have a thickness of approximately 1 nm to approximately 10 nm, with an example thickness of approximately 2 nm to approximately 4 nm.

In block 1140, a gate can be deposited on the gate dielectric. In one embodiment, a gate can be deposited on the gate dielectric. In another embodiment, the gate can include a metal. In another embodiment, the gate can include a transition metal. In one embodiment, the gate can be used to tune the threshold voltage of the device. In one embodiment, gate can titanium nitride, cobalt, tungsten, palladium, molybdenum, germanium, ruthenium, nickel, titanium silicide, and/or platinum. In one embodiment, the gate can have a thickness of approximately 30 nm to approximately 100 nm, with an example thickness of approximately 40 nm to approximately 60 nm. In one embodiment, the gate can be deposited using PVD, CVD, MOCVD, MBE and/or ALD, and the like.

In block 1145, a first spacer material can be deposited on a sidewall of the gate dielectric. In an embodiment, the first spacer material can serve to provide electrical insulation between the gate and the source and/or the drain. In one embodiment, the first spacer material can include silicon oxide or silicon nitride. The spacer can be serve to prevent the source and/or drain from making electrical contact to the gate.

In one embodiment, the first spacer material can have a triangle shape (not shown). This can be due, for example, to an etching step involved in the fabrication of the first spacer material. That is, the first spacer material may be first deposited as a blanket layer, and then an etch can be used to remove a portion of the insulating first spacer material. In one embodiment, the etch can be a directional etch. In another embodiment, the etch may not etch straight downward (in the negative z direction); rather, the etch may have a slight slant and etch more of the top of the first spacer material as well, giving rise to the triangular shape of the first spacer material.

In block 1150, a drain can be deposited on the channel, the drain comprising a first portion and a second portion. In another embodiment, the drain can include a nonreactive metal. In one embodiment, the drain can include tungsten and/or titanium nitride, aluminum, titanium, tantalum nitride, cobalt, and/or nickel material. In another embodiment, the drain can include an n-doped indium gallium arsenide layer. In one embodiment, the drain can include silicon. In another embodiment, the silicon material may be n-doped. In another embodiment, the drain can include doped or undoped black phosphorous, titanium, tantalum, cobalt, molybdenum, titanium nitride, tantalum nitride, hafnium, copper, gadolinium, and the like. In one embodiment, the drain can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the doping can include generating excess electron in the drain. In another embodiment, the source can be doped with phosphorous, boron, aluminum, tin, hafnium, titanium, copper, indium, and/or arsenic if the drain comprises a non-oxide a single-material semiconductor. In another embodiment, the drain can be approximately 1 nanometer to approximately nm thick, with example thicknesses of approximately 10 nm to approximately 50 nm thick. In one embodiment, the drain can be deposited using PVD, CVD, MOCVD, MBE, and/or ALD, and the like. In one embodiment, to reduce gate-induced drain leakage, drain can have a wider band gap than the material used for channel. In one embodiment, for example, in an embodiment used in connection with homojunction TFETs, drain, channel, and source can include the same materials, while source is n-doped, channel 308 is unintentionally doped, and drain is p-doped.

In block 1155, an oxide layer can be deposited on the first portion of the drain material. In one embodiment, the oxide can include an interlayer dielectric (ILD) material. In another embodiment, ILD can include silicon dioxide ($SiO_2$), or a low-K material. In one embodiment, the oxide can be deposited using PVD, CVD, MOCVD, and/or ALD, and the like.

In block 1160, the second portion of the drain can be removed. In an embodiment, the portion of the drain to be removed can include the portion of the drain not covered by the oxide layer. In one embodiment, the removal of the second portion of the drain can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the second portion of the drain.

In block 1165, a first portion of the channel can be removed. In one embodiment, the removal of the first portion of the channel can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the first portion of the channel.

In block 1170, the oxide layer can be removed. In one embodiment, the removal of the oxide can be performed using an etching process. In one embodiment, the etching process can include, for example, a dry etch. In one embodiment, the dry etch can include, for example, a plasma-based and/or a mechanical-based etch. In one embodiment, the etching process can include, for example, a wet etch. The wet etching process can include, for example, any suitable chemicals for the removal of the one of the oxide.

In block 1175, a second spacer material can be deposited on a sidewall of the gate dielectric and a sidewall of the channel. In an embodiment, the second spacer material can serve to provide electrical insulation between the gate and the source and/or the drain. In one embodiment, the second spacer material can include silicon oxide or silicon nitride. The spacer can be serve to prevent the source and/or drain from making electrical contact to the gate.

In one embodiment, the second spacer material can have a triangle shape (not shown). This can be due, for example, to an etching step involved in the fabrication of the second spacer material. That is, the second spacer material may be first deposited as a blanket layer, and then an etch can be used to remove a portion of the insulating second spacer material. In one embodiment, the etch can be a directional etch. In another embodiment, the etch may not etch straight downward (in the negative z direction); rather, the etch may have a slight slant and etch more of the top of the second spacer material as well, giving rise to the triangular shape of the second spacer material.

In block 1180, a first contact can be deposited on the source. In one embodiment, the first contact can serve as a source contact. In another embodiment, the source contact can include a metal. In one embodiment, the source contact 210 can include gold, copper, silver, aluminum, zinc, tin, platinum, titanium, titanium nitride, tantalum nitride, silicide, tungsten, palladium, molybdenum, germanium, ruthenium, nickel any of the like. The source contact can include any alloys of such materials. In one embodiment, the source contact can have a thickness of approximately 2 nm to approximately 100 nm, with example thicknesses of approximately 5 nm to approximately 20 nm. In one embodiment, the source contact can be deposited using PVD, CVD, MOCVD, MBE, and/or ALD, and the like.

In block 1185, a second contact can be deposited on the drain. In one embodiment, second contact can serve as a drain contact. In one embodiment, the drain contact can include a metal. In one embodiment, the drain contact can include gold, copper, silver, aluminum, zinc, tin, platinum, titanium, titanium nitride, tantalum nitride, silicide, tungsten, palladium, molybdenum, germanium, ruthenium, nickel any of the like. The drain contact can include any alloys of such materials. In one embodiment, the drain contract can have a thickness of approximately 2 nm to approximately 100 nm, with example thicknesses of approximately 5 nm to approximately 20 nm. In one embodiment, the drain contract can be deposited using PVD, CVD, MOCVD, MBE, and/or ALD, and the like.

Figure 12:
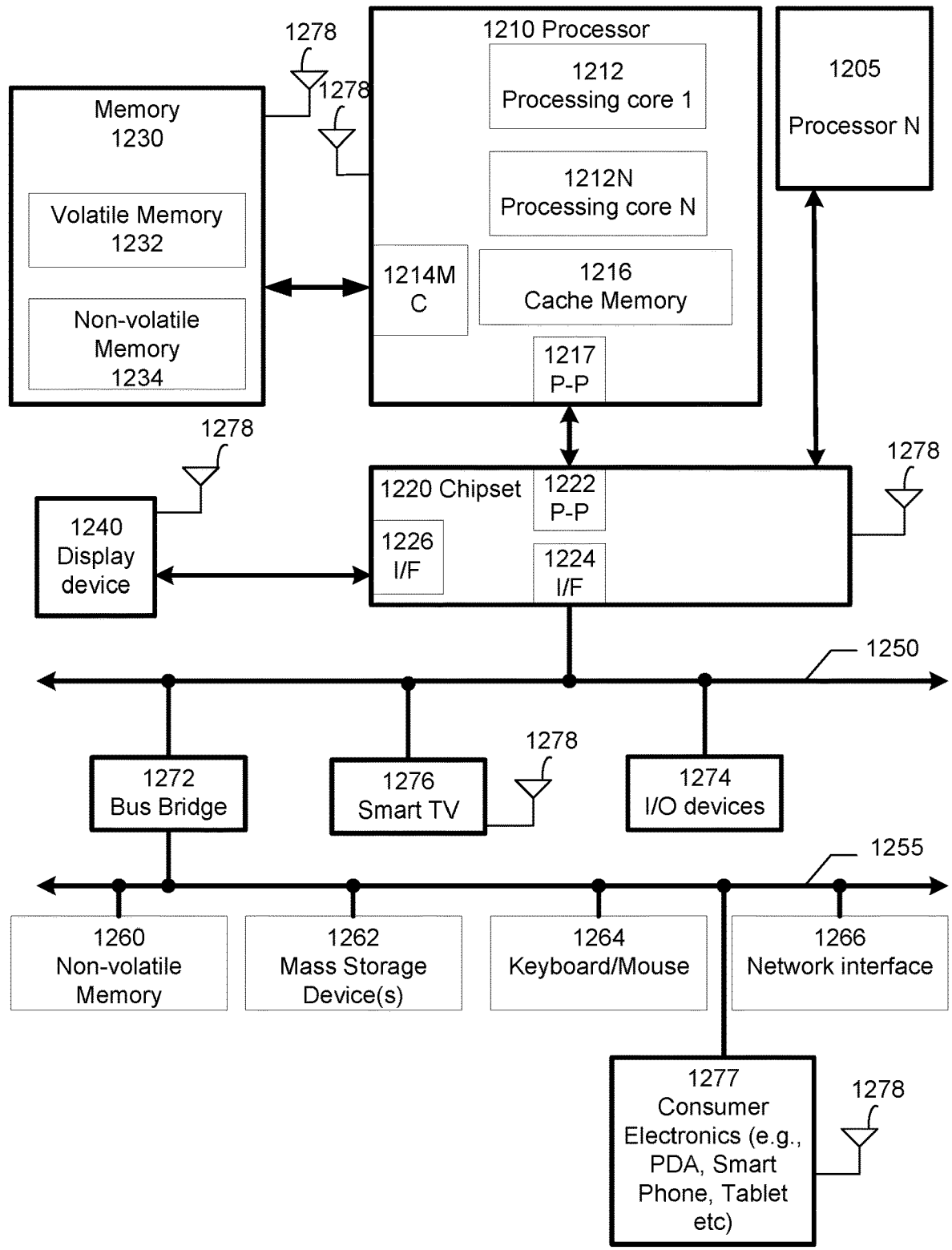
FIG. 12 depicts an example of a system, in accordance with one or more embodiments of the disclosure.

FIG. 12 depicts an example of a system 1200 according to one or more embodiments of the disclosure. In one embodiment, the transistors described herein can be used in connection with or formed as a part of any of the devices shown in system 1200. In one embodiment, system 1200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1200 can include a system on a chip (SOC) system.

In one embodiment, system 1200 includes multiple processors including processor 1210 (in FIG. 12, processor 1210 is labeled as 1210) and processor N 1205, where processor N 1205 has logic similar or identical to the logic of processor 1210. In one embodiment, processor 1210 has one or more processing cores (represented here by processing core 1 1212 and processing core N 1212N, where 1212N represents the Nth processor core inside processor 1210, where N is a positive integer). More processing cores can be present (but not depicted in the diagram of FIG. 12). In some embodiments, processing core 1212 includes, but is not limited to, pre-fetch logic to fetch instructions, decode logic to decode the instructions, execution logic to execute instructions, a combination thereof, or the like. In some embodiments, processor 1210 has a cache memory 1216 to cache instructions and/or data for system 1200. Cache memory 1216 may be organized into a hierarchical structure including one or more levels of cache memory.

In some embodiments, processor 1210 includes a memory controller (MC) 1214, which is configured to perform functions that enable the processor 1210 to access and communicate with memory 1230 that includes a volatile memory 1232 and/or a non-volatile memory 1234. In some embodiments, processor 1210 can be coupled with memory 1230 and chipset 1220. Processor 1210 may also be coupled to a wireless antenna 1278 to communicate with any device configured to transmit and/or receive wireless signals. In one embodiment, the wireless antenna 1278 operates in accordance with, but is not limited to, the IEEE 1102.11 standard and its related family, Home Plug AV (HPAV), Ultra Wide Band (UWB), Bluetooth, WiMax, or any form of wireless communication protocol.

In some embodiments, volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1234 includes, but is not limited to, flash memory, phase change memory (PCM), read-only memory (ROM), electrically erasable programmable read-only memory (EEPROM), or any other type of non-volatile memory device.

Memory device 1230 stores information and instructions to be executed by processor 1210. In one embodiment, memory 1230 may also store temporary variables or other intermediate information while processor 1210 is executing instructions. In the illustrated embodiment, chipset 1220 connects with processor 1210 via Point-to-Point (PtP or P-P) interface 1217 and P-P interface 1222. Chipset 1220 enables processor 1210 to connect to other elements in system 1200. In some embodiments of the disclosure, P-P interface 1217 and P-P interface 1222 can operate in accordance with a PtP communication protocol, such as the Intel® QuickPath Interconnect (QPI) or the like. In other embodiments, a different interconnect may be used.

In some embodiments, chipset 1220 can be configured to communicate with processor 1210, the processor N 1205, display device 1240, and other devices 1272, 1276, 1274, 1260, 1262, 1264, 1266, 1277, etc. Chipset 1220 may also be coupled to the wireless antenna 1278 to communicate with any device configured to transmit and/or receive wireless signals.

Chipset 1220 connects to display device 1240 via interface 1226. Display 1240 may be, for example, a liquid crystal display (LCD), a plasma display, cathode ray tube (CRT) display, or any other form of visual display device. In some embodiments of the disclosure, processor 1210 and chipset 1220 are integrated into a single SOC. In addition, chipset 1220 connects to bus 1250 and/or bus 1255 that interconnect various elements 1274, 1260, 1262, 1264, and 1266. Bus 1250 and bus 1255 may be interconnected via a bus bridge 1272. In one embodiment, chipset 1220 couples with a non-volatile memory 1260, a mass storage device(s) 1262, a keyboard/mouse 1264, and a network interface 1266 via interface 1224 and/or 1226, smart TV 1276, consumer electronics 1277, etc.

In one embodiment, mass storage device(s) 1262 can include, but not be limited to, a solid state drive, a hard disk drive, a universal serial bus flash memory drive, or any other form of computer data storage medium. In one embodiment, network interface 1266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 12 are depicted as separate blocks within the system 1200, the functions performed by some of these blocks may be integrated within a single semiconductor circuit or may be implemented using two or more separate integrated circuits. For example, although cache memory 1216 is depicted as a separate block within processor 1210, cache memory 1216 or selected elements thereof can be incorporated into processor core 1212.

It is noted that the system 1200 described herein may include any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor devices, as disclosed herein. The semiconductor devices (for example, the semiconductor devices described in connection with any of FIGS. 1-11), as disclosed herein, may be provided in any variety of electronic devices including consumer, industrial, military, communications, infrastructural, and/or other electronic devices.

In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Example 1 may include an integrated circuit (IC) structure comprising: an isolation structure on a substrate, the isolation structure including a trench; a buffer material in the trench; a source on the buffer material; a channel on a portion of the source, the channel including a first portion and a second portion; a drain on the first portion of the channel; a gate dielectric on the second portion of the channel; and a gate on the gate dielectric.

Example 2 may include the structure of example 1 and/or some other example herein, further comprising a first contact electrode on the source and a second contact electrode on the drain.

Example 3 may include the structure of example 1 and/or some other example herein, wherein the trench comprises a silicon aspect ratio trapping (ART) trench.

Example 4 may include the structure of example 2 and/or some other example herein, further comprising a first spacer between a sidewall of the gate dielectric and a sidewall of the drain.

Example 5 may include the structure of example 4 and/or some other example herein, further comprising a second spacer between a sidewall of the channel and a sidewall of the first contact electrode.

Example 6 may include the structure of example 1 and/or some other example herein, wherein the channel is gated by the gate and gate dielectric on at least a first sidewall of the channel.

Example 7 may include the structure of example 6 and/or some other example herein, wherein the sidewall of the channel has Miller indices of (110).

Example 8 may include the structure of example 1 and/or some other example herein, wherein the substrate comprises silicon, germanium, a III-V semiconductor, or gallium and nitrogen.

Example 9 may include the structure of example 1 and/or some other example herein, wherein the buffer material comprises a III-V semiconductor.

Example 10 may include the structure of example 1 and/or some other example herein, wherein the IC structure comprises an n-type vertical TFET and wherein the source comprises a p-doped material.

Example 11 may include the structure of example 10 and/or some other example herein, wherein the source comprises gallium and antimony.

Example 12 may include the structure of example 1 and/or some other example herein, wherein the IC structure comprises an n-type vertical TFET and wherein the drain comprises an n-doped material.

Example 13 may include the structure of example 12 and/or some other example herein, wherein the drain comprises indium and arsenic.

Example 14 may include the structure of example 1 and/or some other example herein, wherein the channel comprises indium and arsenic.

Example 15 may include a device including a vertical tunneling field effect transistor (TFET), the device comprising: an isolation structure on a substrate, the isolation structure including a trench; a buffer material in the trench; a source on the buffer material; a channel on a portion of the source, the channel including a first portion and a second portion; a drain on the first portion of the channel; a gate dielectric on the second portion of the channel; and a gate on the gate dielectric.

Example 16 may include the device of example 15 and/or some other example herein, further comprising a first contact electrode on the source and a second contact electrode on the drain.

Example 17 may include the device of example 15 and/or some other example herein, wherein the trench comprises a silicon aspect ratio trapping (ART) trench.

Example 18 may include the device of example 16 and/or some other example herein, further comprising a first spacer between a sidewall of the gate dielectric and a sidewall of the drain.

Example 19 may include the device of example 18 and/or some other example herein, further comprising a second spacer between a sidewall of the channel and a sidewall of the first contact electrode.

Example 20 may include the device of example 15 and/or some other example herein, wherein the vertical TFET is an n-type vertical TFET and wherein the source comprises a p-doped material.

Example 21 may include the device of example 15 and/or some other example herein, wherein the vertical TFET is an n-type vertical TFET and wherein the drain comprises an n-doped material.

Example 22 may include a method for fabricating an integrated circuit (IC) structure, the method comprising: depositing an isolation structure on a first portion of a substrate; depositing a buffer material on a second portion of the substrate; depositing a source on the buffer material; depositing a channel on a portion of the source, the channel including a first portion and a second portion; depositing a drain on the first portion of the channel; depositing a gate dielectric on the second portion of the channel; and depositing a gate on the gate dielectric.

Example 23 may include the method of example 22 and/or some other example herein, wherein depositing the buffer material comprises depositing a III-V semiconductor.

Example 24 may include the method of example 22 and/or some other example herein, wherein the IC structure comprises an n-type vertical TFET and wherein depositing the source comprises depositing a p-doped material.

Example 25 may include the method of example 22 and/or some other example herein, wherein the IC structure comprises an n-type vertical TFET and wherein depositing the drain comprises depositing an n-doped material.

Example 26 may include a device comprising an integrated circuit (IC) structure comprising: an isolation structure on a substrate, the isolation structure including a trench; a buffer material in the trench; a source on the buffer material; a channel on a portion of the source, the channel including a first portion and a second portion; a drain on the first portion of the channel; a gate dielectric on the second portion of the channel; and a gate on the gate dielectric.

Example 27 may include the device of example 26 and/or some other example herein, further comprising a first contact electrode on the source and a second contact electrode on the drain.

Example 28 may include the device of example 26 and/or some other example herein, wherein the trench comprises a silicon aspect ratio trapping (ART) trench.

Example 29 may include the device of example 27 and/or some other example herein, further comprising a first spacer between a sidewall of the gate dielectric and a sidewall of the drain.

Example 30 may include the device of example 29 and/or some other example herein, further comprising a second spacer between a sidewall of the channel and a sidewall of the first contact electrode.

Example 31 may include the device of example 26 and/or some other example herein, wherein the channel is gated by the gate and gate dielectric on at least a first sidewall of the channel.

Example 32 may include the device of example 31 and/or some other example herein, wherein the sidewall of the channel has Miller indices of (110).

Example 33 may include the device of example 26 and/or some other example herein, wherein the substrate comprises silicon, germanium, a III-V semiconductor, or gallium and nitrogen.

Example 34 may include the device of example 26 and/or some other example herein, wherein the buffer material comprises a III-V semiconductor.

Example 35 may include the device of example 26 and/or some other example herein, wherein the IC structure comprises an n-type vertical TFET and wherein the source comprises a p-doped material.

Example 36 may include the device of example 35 and/or some other example herein, wherein the source comprises gallium and antimony.

Example 37 may include the device of example 26 and/or some other example herein, wherein the IC structure comprises an n-type vertical TFET and wherein the drain comprises an n-doped material.

Example 38 may include the device of example 37 and/or some other example herein, wherein the drain comprises indium and arsenic.

Example 39 may include the device of example 26 and/or some other example herein, wherein the channel comprises indium and arsenic.

Example 40 may include a method for fabricating a device comprising an integrated circuit (IC) structure, the method comprising: depositing an isolation structure on a first portion of a substrate; depositing a buffer material on a second portion of the substrate; depositing a source on the buffer material; depositing a channel on a portion of the source, the channel including a first portion and a second portion; depositing a drain on the first portion of the channel; depositing a gate dielectric on the second portion of the channel; and depositing a gate on the gate dielectric.

Example 41 may include the method of example 40 and/or some other example herein, wherein depositing the buffer material comprises depositing a III-V semiconductor.

Example 42 may include the method of example 40 and/or some other example herein, wherein the IC structure comprises an n-type vertical TFET and wherein depositing the source comprises depositing a p-doped material.

Example 43 may include the method of example 40 and/or some other example herein, wherein the IC structure comprises an n-type vertical TFET and wherein depositing the drain comprises depositing an n-doped material.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A transistor structure comprising:
    a source material;
    a channel material on a first portion of the source material;
    a drain material on a first portion of the channel material;
    a gate dielectric on a second portion of the channel material, the second portion of the channel material laterally adjacent to the first portion of the channel material, and the gate dielectric laterally adjacent to the drain material; and
    a gate electrode on the gate dielectric, wherein a sidewall of the gate electrode is laterally adjacent to a sidewall of the drain material.

2. The transistor structure of claim 1, further comprising a buffer material in contact with a substrate material, wherein:
    the source material is on the buffer material; and
    the substrate material comprises a group IV material and the buffer material comprises a Group III-V material.

3. The transistor structure of claim 2, further comprising:
    an isolation material on the substrate material; and wherein:
        the buffer material is within a trench through the isolation material; and
        the trench has a depth of at least 50 nm and a width less than 20 nm.

4. The transistor structure of claim 1, wherein:
the source material has a first conductivity type; and
the drain material has a second conductivity type, complementary to the first conductivity type.

5. The transistor structure of claim 4, wherein the source material comprises p-type impurities and the drain material comprises n-type impurities.

6. The transistor structure of claim 5, wherein the source material comprises gallium and antimony.

7. The transistor structure of claim 6, wherein the drain material comprises indium and arsenic.

8. The transistor structure of claim 7, wherein the channel material comprises indium and arsenic and has lower impurity concentration than the drain material.

9. The transistor structure of claim 4, wherein the source material comprises n-type impurities and the drain material comprises p-type impurities.

10. The transistor structure of claim 1, further comprising a first contact electrode on a second portion of the source material, laterally adjacent to the first portion of the source material, and a second contact electrode on the drain material, wherein the gate electrode is between the first contact electrode and the second contact electrode.

11. The transistor structure of claim 10, further comprising a first dielectric spacer between a sidewall of the gate dielectric and a sidewall of the drain material.

12. The transistor structure of claim 11, further comprising a second dielectric spacer between a sidewall of the channel material and a sidewall of the first contact electrode.

13. The transistor structure of claim 1, wherein a fin structure comprises at least the channel material, and the channel material is gated by the gate electrode and gate dielectric on at least a first sidewall of the channel material.

14. The transistor structure of claim 13, wherein the sidewall of the channel material comprises a (110) crystal facet.

15. A method for fabricating an integrated circuit (IC) structure, the method comprising:
epitaxially growing a source material over a substrate material, and adjacent to a sidewall of an isolation material;
forming a channel material on a first portion of the source material, wherein forming the channel material further comprises epitaxially growing the channel material on the source material and adjacent to a sidewall of the isolation material;
forming a drain material on a first portion of the channel material;
forming a gate dielectric on a second portion of the channel material, and laterally adjacent to the drain material; and
forming a gate electrode on the gate dielectric, with a sidewall of the gate electrode laterally adjacent to a sidewall of the drain material.

16. The method of claim 15, further comprising forming a buffer on the substrate material, wherein forming the buffer further comprises:
depositing the isolation material over the substrate material;
etching a trench through the isolation material to expose the substrate material; and
epitaxially growing the buffer upon the substrate material.

17. The method of claim 15, wherein growing the source material comprises growing a semiconductor material having a first conductivity type, and wherein growing the drain material comprises growing a semiconductor material having a second conductivity type, complementary to the first conductivity type.

18. The method of claim 15, wherein:
forming the gate dielectric further comprises recessing the isolation material to expose a sidewall of the channel material, and depositing the gate dielectric over the sidewall of the channel material; and
the method further comprises:
exposing a portion of the source material by etching through a portion of the channel material adjacent to a sidewall of the gate electrode; and
depositing a first electrode contact on the portion of the source material exposed adjacent to the sidewall of the gate electrode.

19. An electronic device, comprising:
an electronic memory; and
a processor, wherein the processor further comprises a transistor structure, the transistor structure comprising:
a source material;
a channel material on a first portion of the source material;
a drain material on a first portion of the channel material;
a gate dielectric on a second portion of the channel material, the second portion of the channel material laterally adjacent to the first portion of the channel material, and the gate dielectric laterally adjacent to the drain material; and
a gate electrode on the gate dielectric, wherein a sidewall of the gate electrode is laterally adjacent to a sidewall of the drain material.

20. The electronic device of claim 19, wherein the transistor structure comprises a tunnel field effect transistor (TFET).

* * * * *